US012754446B2

(12) United States Patent
Mori et al.

(10) Patent No.: US 12,754,446 B2
(45) Date of Patent: Oct. 6, 2026

(54) VIEWING ANGLE CONTROLLABLE TOUCH PANEL DEVICE AND DISPLAY DEVICE

(71) Applicant: Tianma Japan, Ltd., Kawasaki (JP)

(72) Inventors: Shigeru Mori, Kawasaki (JP); Koji Shigemura, Kawasaki (JP); Yuichi Uchiyama, Kawasaki (JP); Hiroshi Haga, Kawasaki (JP); Mamoru Okamoto, Kawasaki (JP); Ayuko Imai, Kawasaki (JP); Tetsuro Tashiro, Kawasaki (JP); QiJun Yao, Shanghai (CN)

(73) Assignee: TIANMA JAPAN, LTD., Kawasaki (JP)

( * ) Notice: Subject to any disclaimer, the term of this patent is extended or adjusted under 35 U.S.C. 154(b) by 0 days.

(21) Appl. No.: 19/379,539

(22) Filed: Nov. 4, 2025

(65) Prior Publication Data

US 2026/0133445 A1 May 14, 2026

(30) Foreign Application Priority Data

Nov. 8, 2024 (JP) ................................ 2024-196171
Aug. 29, 2025 (JP) ................................ 2025-143375

(51) Int. Cl.
*G02F 1/13* (2006.01)
*G02F 1/1333* (2006.01)
(Continued)

(52) U.S. Cl.
CPC ........ *G02F 1/1323* (2013.01); *G02F 1/13338* (2013.01); *G02F 1/167* (2013.01);
(Continued)

(58) Field of Classification Search
CPC .... G02F 1/1323; G02F 1/13338; G02F 1/167; G06F 3/04164; G06F 3/0412;
(Continued)

(56) References Cited

U.S. PATENT DOCUMENTS

2019/0102007 A1 4/2019 Ito
2019/0146604 A1 * 5/2019 Uchiyama .............. G06F 21/84 345/175
2019/0155440 A1 5/2019 Ito et al.

* cited by examiner

*Primary Examiner* — Deeprose Subedi
(74) *Attorney, Agent, or Firm* — NIXON & VANDERHYE

(57) ABSTRACT

A viewing angle controllable touch panel device includes an upper transparent substrate, a lower transparent substrate, one lower viewing angle control electrode on a top face of the lower transparent substrate, lower touch panel electrodes on the top face of the lower transparent substrate, upper touch panel electrodes on an under face of the upper transparent substrate, and electrophoretic elements disposed between the under face of the upper transparent substrate and the top face of the lower transparent substrate. The electrophoretic element includes electrophoretic particles and a dispersion medium. The lower touch panel electrodes are included in a layer upper than the lower viewing angle control electrode. The lower touch panel electrode at least partially overlaps the lower viewing angle control electrode in a planar view. The electrophoretic element is sandwiched between one of the upper touch panel electrodes and the lower viewing angle control electrode.

9 Claims, 29 Drawing Sheets

(51) Int. Cl.
*G02F 1/167* (2019.01)
*G06F 3/041* (2006.01)
*G09G 3/3208* (2016.01)
*H10K 59/40* (2023.01)
*H10K 59/50* (2023.01)

(52) U.S. Cl.
CPC ....... *G06F 3/04164* (2019.05); *G09G 3/3208* (2013.01); *H10K 59/40* (2023.02); *H10K 59/50* (2023.02); *G06F 3/0412* (2013.01); *G09G 2310/08* (2013.01); *G09G 2320/028* (2013.01); *G09G 2354/00* (2013.01)

(58) Field of Classification Search
CPC ............. G09G 3/3208; G09G 2310/08; G09G 2320/028; G09G 2354/00; H10K 59/40; H10K 59/50
See application file for complete search history.

VIEWING ANGLE CONTROLLABLE TOUCH PANEL DEVICE AND DISPLAY DEVICE

CROSS-REFERENCE TO RELATED APPLICATIONS

This non-provisional application claims priority under 35 U.S.C. § 119(a) on Patent Application No. 2024-196171 filed in Japan on Nov. 8, 2024 and Patent Application No. 2025-143375 filed in Japan on Aug. 29, 2025, the entire contents of which are hereby incorporated by reference.

BACKGROUND

This disclosure relates to a viewing angle controllable touch panel device and a display device.

As electronic devices including a display device with an input function, namely a touch panel, smartphones and tablet terminals are widely available in the world. These are used in various scenes as tools to share information with many people.

Touch panels are categorized into several types such as capacitive type, resistive type, optical type, ultrasound type, and electromagnetic induction type; mostly, the capacitive type is employed for the smartphones and tablet terminals. The touch panels are applied to various kinds of display devices such as liquid crystal display devices and organic electroluminescence (EL) display devices. In recent years, so-called on-cell technology has been employed in view of the advantage to achieve thinner display devices. The on-cell technology provides lines for a touch panel directly on top of the inorganic or organic encapsulation film encapsulating organic electroluminescence (EL) elements.

Meanwhile, from the standpoint of personal information protection, display devices having a function to limit the viewing angle are widely available to prevent someone from peeking at a displayed image in the public space such as parks, trains, and ATMs. Particularly, display devices that can switch between a wide viewing angle and a narrow viewing angle have attracted attention.

Some methods to actively control the viewing angle between a wide angle and a narrow angle are known. One example uses a louver and polymer-network liquid crystal (PNLC). Another known example uses electrophoretic ink that has a relatively short response time to switch between a wide viewing angle and a narrow viewing angle. The display device employing either method has two electrodes and controls the viewing angle with the electric field generated between those electrodes.

The organic EL display device having both of the touch panel function and the viewing angle control function can be an electronic device expected for various applications because of its thinner form and more functions than the conventional ones.

SUMMARY

A viewing angle controllable touch panel device according to an aspect of this disclosure includes an upper transparent substrate, a lower transparent substrate, one lower viewing angle control electrode on a top face of the lower transparent substrate, a plurality of lower touch panel electrodes on the top face of the lower transparent substrate, a plurality of upper touch panel electrodes on an under face of the upper transparent substrate, and a plurality of electrophoretic elements disposed between the under face of the upper transparent substrate and the top face of the lower transparent substrate. Each of the plurality of electrophoretic elements includes electrophoretic particles and a dispersion medium. The plurality of lower touch panel electrodes are included in a layer upper than the lower viewing angle control electrode. Each of the plurality of lower touch panel electrodes at least partially overlaps the lower viewing angle control electrode in a planar view. Each of the plurality of electrophoretic elements is sandwiched between one of the plurality of upper touch panel electrodes and the lower viewing angle control electrode.

A display device according to an aspect of this disclosure includes an OLED display panel, a viewing angle controllable touch panel device disposed on the display panel, and a controller. The viewing angle controllable touch panel device includes a plurality of upper viewing angle control electrodes, a plurality of first touch panel electrodes and a plurality of second touch panel electrodes disposed on a thin-film encapsulation structure of the OLED display panel without a substrate interposed, and a plurality of electrophoretic elements disposed between the plurality of upper viewing angle control electrodes and a touch panel electrode array including the plurality of first touch panel electrodes and the plurality of second touch panel electrodes in a layering direction, each electrophoretic element including electrophoretic particles and a dispersion medium. The controller is configured to control potentials of the plurality of upper viewing angle control electrodes. The controller is configured to conduct the potential control in a sensing period and a non-sensing period that are repeated alternately. The controller is configured to perform touch sensing in the sensing period by controlling potentials of the plurality of first touch panel electrodes and the plurality of second touch panel electrodes. The controller is configured to control a viewing angle in the non-sensing period by controlling states of electrophoretic particles in the plurality of electrophoretic elements with electric fields between the plurality of upper viewing angle control electrodes and the plurality of first and second touch panel electrodes. The non-sensing period is longer than the sensing period.

It is to be understood that both the foregoing general description and the following detailed description are exemplary and explanatory and are not restrictive of this disclosure.

EMBODIMENTS

Figure 1:
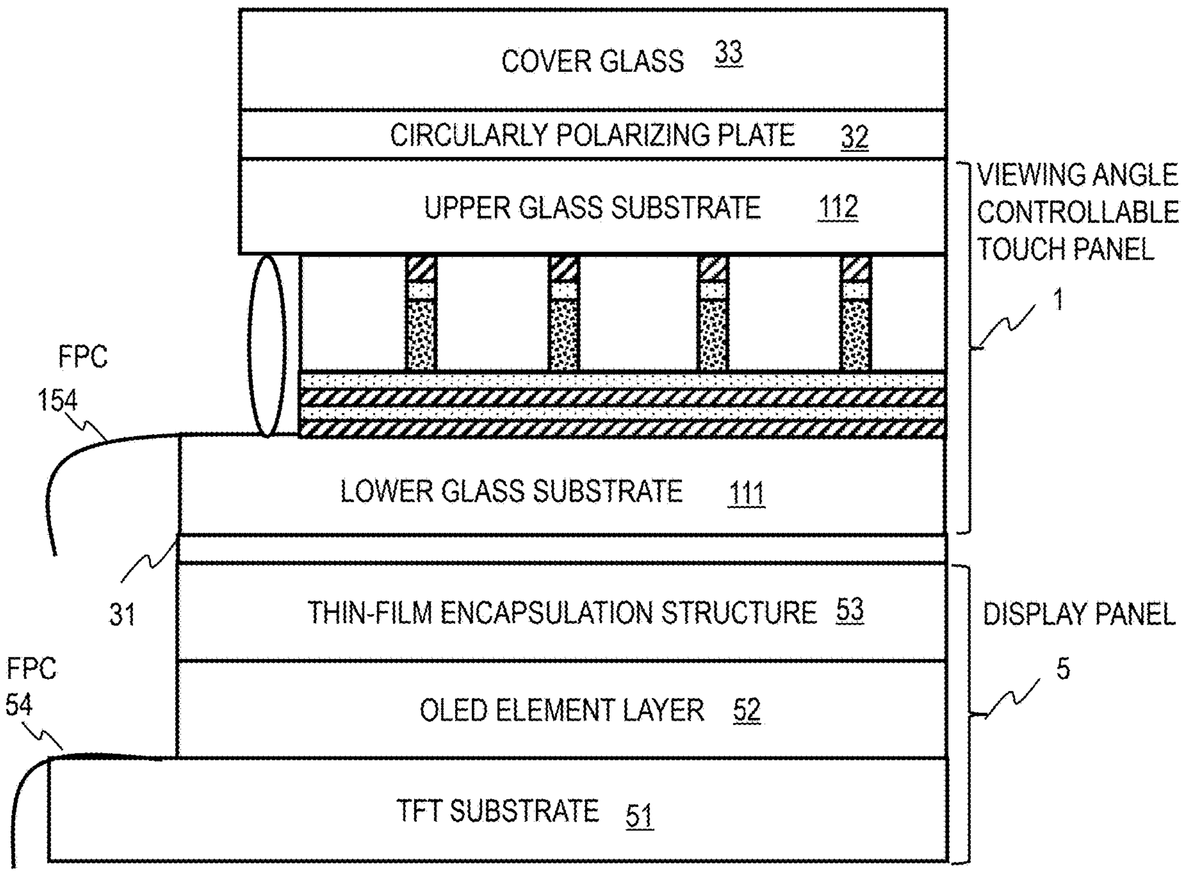
FIG. 1 schematically illustrates a configuration example of a display device in an embodiment of this specification.

Hereinafter, embodiments will be described with reference to the accompanying drawings. The embodiments are merely examples to implement this disclosure and not to limit the technical scope of this disclosure. Elements common to the drawings are denoted by the same reference signs and some elements in the drawings are exaggerated in size or shape for clear understanding of the description.

Capacitive touch panels (touch sensors) detect a touch point by measuring the variation in capacitance caused by a contact of a finger onto the device surface. A capacitance is varied by the capacitance generated between the finger and an electrode.

When another electrode is provided between the touch panel and the surface of the display device, an electric field is generated between the touch panel and the electrode and no electric field is generated on the surface of the display device. Accordingly, no capacitance is generated between a finger and an electrode of the touch sensor and therefore, the capacitive touch sensing does not work. This means that, in the case where a structure having an active viewing angle control function that controls the viewing angle (the travel direction of transmitted light) with electric fields between electrodes is simply fabricated on a touch panel, making the both functions work properly is difficult, in principle.

Another configuration where a touch panel is laid above an active viewing angle control device (active louver) does not cause the above-described problem. However, stacking a viewing angle control device and a touch panel that are independent from each other increases the overall thickness of the device.

The viewing angle controllable touch panel in an embodiment of this specification includes a lower viewing angle control electrode and a plurality of lower touch panel electrodes on the top face of a lower transparent substrate and a plurality of upper touch panel electrodes on the under face of an upper transparent substrate. The upper touch panel electrodes are electrodes common to touch sensing and viewing angle control. A plurality of electrophoretic elements are provided between the under face of the upper transparent substrate and the top face of the lower transparent substrate. Each electrophoretic element is sandwiched between an upper touch panel electrode and the lower viewing angle control electrode. This configuration enables integration of the viewing angle control device with the touch panel (touch sensor), while achieving a small thickness of the overall device.

Embodiment 1

FIG. 1 schematically illustrates a configuration example of a display device in an embodiment of this specification. The display device includes a display panel 5 and a viewing angle controllable touch panel 1 disposed in front of the display panel 5. The viewing angle controllable touch panel 1 and the display panel 5 are bonded together by a resin adhesive layer 31. The adhesive layer 31 between the viewing angle controllable touch panel 1 and the display panel 5 can be provided only between the outer regions of these panels.

The display panel 5 can be of any kind, such as an organic light-emitting diode (OLED) display panel, a liquid crystal display panel, or a micro-LED panel. FIG. 1 shows an OLED display panel by way of example.

The display panel 5 includes an OLED element layer 52 above a thin-film transistor (TFT) substrate 51. The OLED element layer 52 and the TFT layer thereunder are covered with a thin-film encapsulation structure 53. The OLED element layer 52 includes an OLED element array composed of a plurality of OLED elements (light-emitting elements) arrayed in a plane. Each OLED element is a pixel that emits light in a specific color. All OLED elements may emit white light or the OLED element layer 52 may include OLED elements for emitting red, green, and blue light.

The TFT layer includes a pixel circuit array including a plurality of pixel circuits for individually controlling light emission of the OLED elements. Each pixel circuit includes a driving TFT for controlling the lighting current to the OLED element and a plurality of switching TFTs. Each pixel circuit operates in accordance with control signals to supply lighting current specified by a data signal from a power line to the OLED element through the driving TFT. The signal and the power to the pixel circuit can be provided from a controller not shown in FIG. 1 via flexible printed circuits (FPC) 54.

The side where the user to view the image on the display panel 5 is located or the side toward which the rays of light of the image travel is defined as front or upper side and the opposite side as back or lower side. The direction perpendicular to the main faces of the display panel 5 and the viewing angle controllable touch panel 1 is defined as z-axis direction and the two directions perpendicular to each other within either main face as x-axis direction and y-axis direction. The z-axis direction is the direction of layering the display panel 5 and the viewing angle controllable touch panel 1.

The viewing angle controllable touch panel 1 has the function of a touch sensor and also, the function of an active louver (ALV) for controlling the travel direction of the rays of light to go through out of the rays of light emitted from the display panel 5. The functional layers of the touch sensor and the travel direction control for the light are sandwiched by two glass substrates 111 and 112. The control signal for the viewing angle controllable touch panel 1 is provided from the controller not shown in FIG. 1 via an FPC 154, for example.

The viewing angle controllable touch panel 1 can switch ranges to transmit the image on the display panel 5 by switching between a wide view state and a narrow view state. The state (mode) to emit light from the viewing angle controllable touch panel 1 in a wide angle is referred to as a wide view state (wide view mode) and the state (mode) to emit light in a narrow angle is referred to as a narrow view state (narrow view mode). FIG. 1 illustrates the viewing angle controllable touch panel 1 in the narrow view state.

A circularly polarizing plate 32 is provided above the glass substrate 112 on the front of the viewing angle controllable touch panel 1 and a cover glass 33 is provided above the circularly polarizing plate 32. A pointer such as a finger touches the surface of the cover glass 33 and the viewing angle controllable touch panel 1 detects the touch point. The circularly polarizing plate 32 decreases the reflection off the reflective electrodes (e.g., the anode electrodes) of the OLED elements. The circularly polarizing plate 32 and the cover glass 33 are optional.

Figure 2:
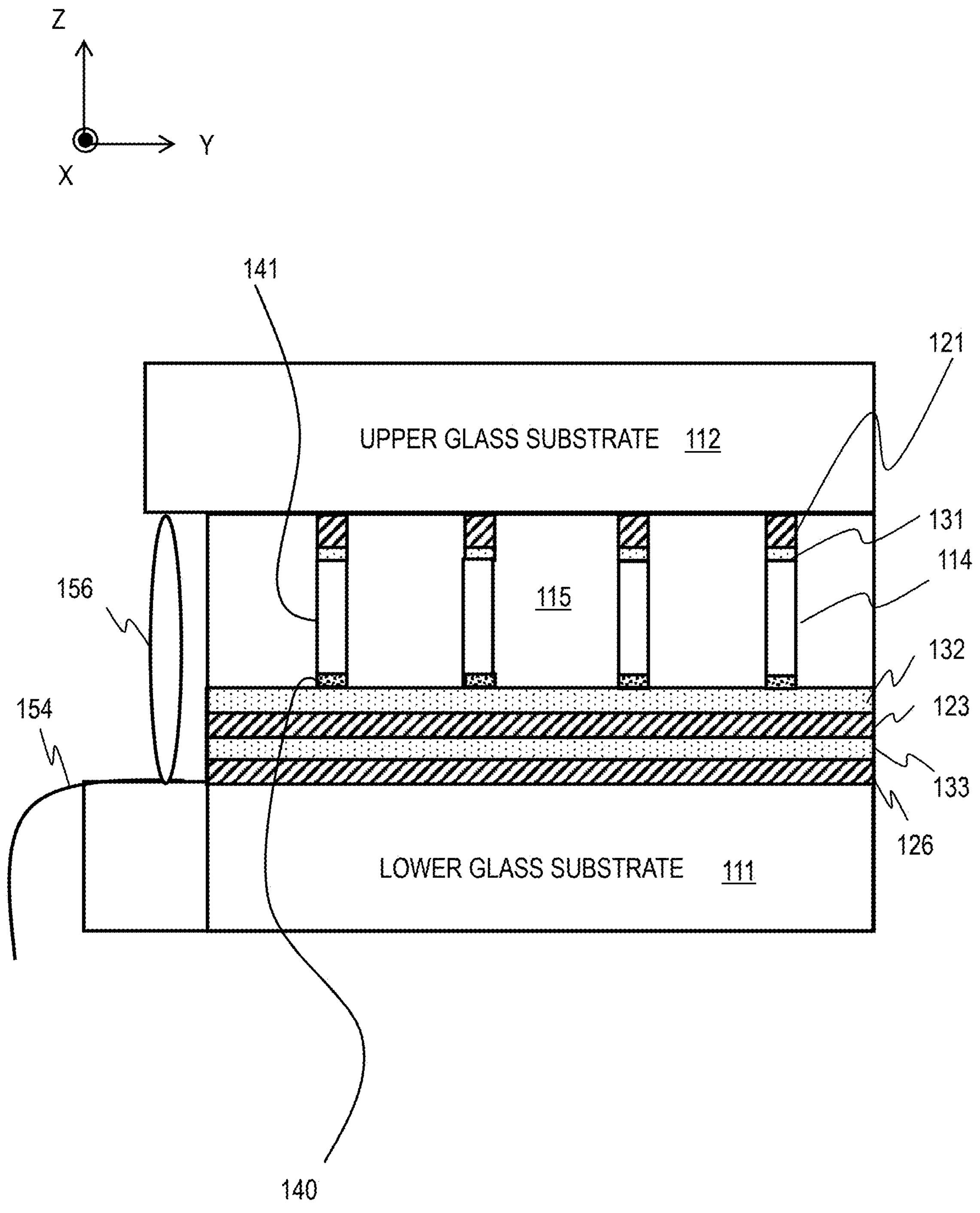
FIG. 2 is a cross-sectional diagram schematically illustrating the structure of a viewing angle controllable touch panel.
Figure 3:
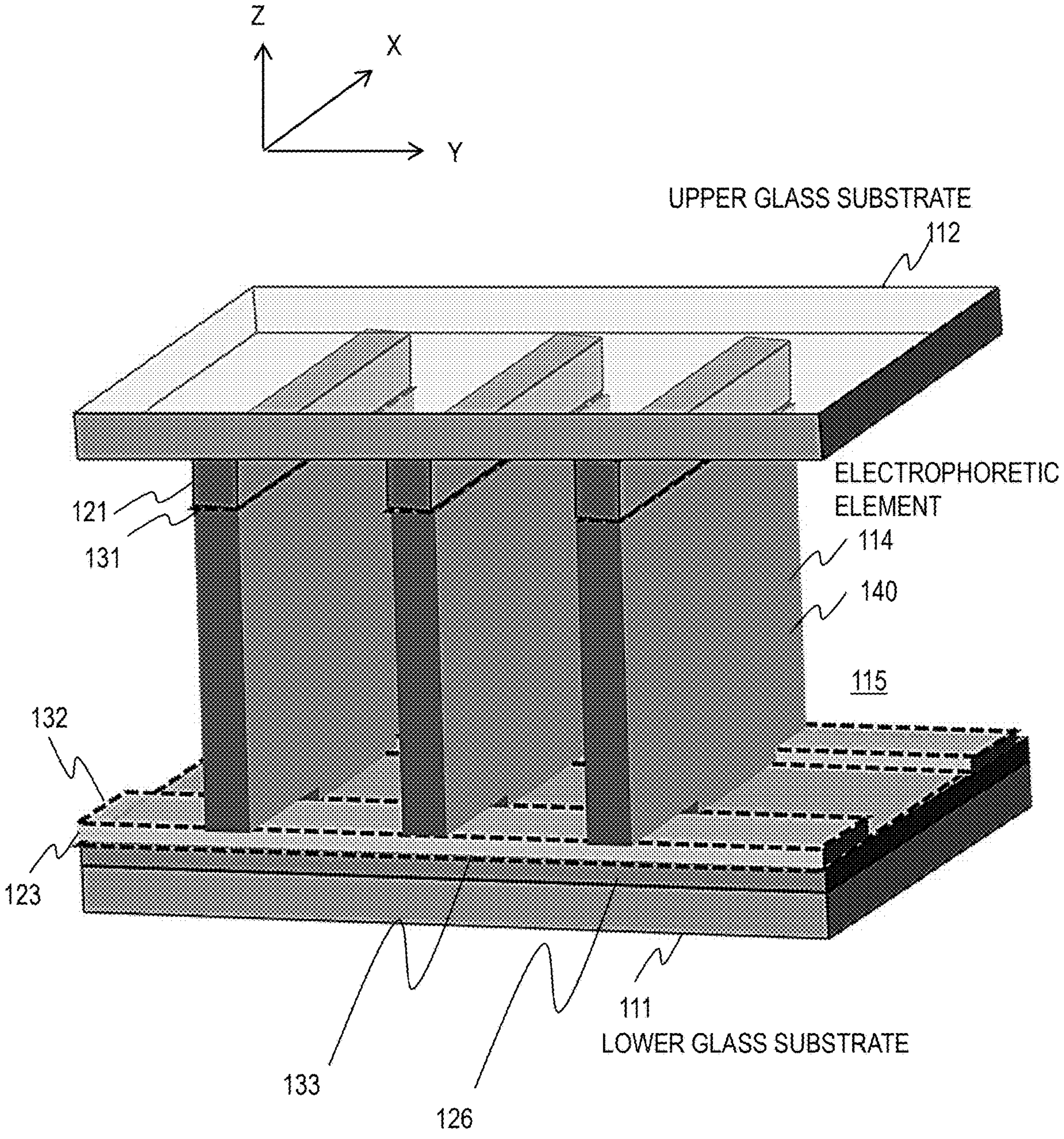
FIG. 3 is a perspective diagram schematically illustrating the structure of a viewing angle controllable touch panel.

FIG. 2 is a cross-sectional diagram and FIG. 3 is a perspective diagram schematically illustrating the structure of the viewing angle controllable touch panel 1. FIG. 2 illustrates the viewing angle controllable touch panel 1 in a wide view state and FIG. 3 illustrates the viewing angle controllable touch panel 1 in a narrow view state.

The viewing angle controllable touch panel 1 changes the dispersion state of colored electrophoretic particles (colored charged particles) 140 in a dispersion medium 141 in each of the electrophoretic elements 114 disposed between the upper glass substrate 112 and the lower glass substrate 111 to change the emission angle range for the light transmitted through the region between the upper glass substrate 112 and the lower glass substrate 111. Specifically, in the wide view state illustrated in FIG. 2, the electrophoretic particles 140 are gathered in the vicinity of one electrode, which is the lower viewing angle control electrode 126 in this example. In the narrow view state illustrated in FIG. 3, the electrophoretic particles 140 are dispersed in each electrophoretic element 114.

The viewing angle controllable touch panel 1 includes an upper glass substrate 112 and a lower glass substrate 111. The under face of the lower glass substrate 111 is opposed to the display panel 5 shown in FIG. 1 and the top face is opposed to the under face of the upper glass substrate 112. The upper glass substrate 112 and the lower glass substrate 111 are transparent substrates and they can be made of a material different from glass. For example, they can be made of polyethylene terephthalate (PET), polycarbonate (PC), or polyethylene naphthalate (PEN). The upper glass substrate 112 and the lower glass substrate 111 are flexible or inflexible insulators.

The viewing angle controllable touch panel 1 further includes a plurality of upper touch panel electrodes 121, a plurality of lower touch panel electrodes 123, and one lower viewing angle control electrode 126. The upper touch panel electrodes 121 and the lower touch panel electrodes 123 can be made of a transparent conductor such as ITO or ZnO or an opaque metal such as Mo or Al. The lower viewing angle control electrode 126 can be made of a transparent conductor such as ITO or ZnO. FIG. 2 illustrates an example of a mutual capacitance type of viewing angle controllable touch panel 1. Another scheme of projected capacitive sensing, self-capacitive touch sensing, can be employed.

The plurality of upper touch panel electrodes (the upper touch panel electrode pattern) 121 are located on the under face of the upper glass substrate 112. The upper touch panel electrodes 121 are disposed to extend in the x-axis direction and to be distant from one another in the y-axis direction on the upper glass substrate 112. Each upper touch panel electrode 121 can be a strip-like conductor. The upper touch panel electrode 121 can be referred to as X electrode.

Each upper touch panel electrode 121 is opposed to an electrophoretic element 114 and not to a transparent region (light transmissive region) 115 between electrophoretic elements 114. The upper touch panel electrode 121 is also an upper viewing angle control electrode, achieving a thinner device. An insulating film 131 is provided between the electrophoretic element 114 and the upper touch panel electrode 121. Although the material for the insulating film 131 is selected desirably, silicon nitride or silicon oxide can be employed, for example.

The signals between the upper touch panel electrodes 121 and the FPC 154 can be transmitted through an anisotropic conducting film (ACF) 156 that is in contact with the under face of the upper glass substrate 112 and the top face of the lower glass substrate 111.

The plurality of lower touch panel electrodes (the lower touch panel electrode pattern) 123 are located on the top face of the lower glass substrate 111. The layer of electrophoretic elements 114 is located between the upper touch panel electrode pattern and the lower touch panel electrode pattern. The lower touch panel electrodes 123 are disposed to extend in the y-axis direction and to be distant from one another in the x-axis direction on the lower glass substrate 111. Each lower touch panel electrode 123 can be a strip-like conductor. The lower touch panel electrode 123 can be referred to as Y electrode.

The upper touch panel electrodes 121 and the lower touch panel electrodes 123 are disposed in a matrix. The change in capacitance between an upper touch panel electrode 121 and a lower touch panel electrode 123 enables detection of a touch point of a pointer (e.g., a finger).

Insulating films 132 are provided between the electrophoretic elements 114 and the lower touch panel electrodes 123. Although the material for the insulating films 132 covering the lower touch panel electrodes 123 is selected desirably, silicon nitride or silicon oxide can be employed, for example.

The lower viewing angle control electrode 126 is located on the top face of the lower glass substrate 111. The lower viewing angle control electrode 126 is located between the layer of the lower touch panel electrodes 123 and the top face of the lower glass substrate 111. In a planar view, at least a part of the region of a lower touch panel electrode 123 overlaps the lower viewing angle control electrode 126. An insulating film 133 is provided between the lower viewing angle control electrode 126 and the lower touch panel electrodes 123. Although the material for the insulating film 133 covering the lower viewing angle control electrode 126 is selected desirably, silicon nitride or silicon oxide can be employed, for example.

The lower viewing angle control electrode 126 is a sheet-like single electrode opposed to all electrophoretic elements 114 and all upper touch panel electrodes 121. That is to say, the lower viewing angle control electrode 126 is the lower viewing angle control electrode common to all electrophoretic elements 114. The states of the electrophoretic elements 114 are switched between a light blocking state and a light transmissive state by the voltages (electric fields) between the upper touch panel electrodes 121 and the lower viewing angle control electrode 126. The lower viewing angle control electrode 126 covers the viewing angle control regions or the regions whose states are switched between the light blocking state and the light transmissive state. The area of the lower viewing angle control electrode 126 is equal to or larger than the area of the viewing angle control region.

There can be a plurality of lower viewing angle control electrodes 126 each opposed to one or more electrophoretic elements 114 and one or more upper touch panel electrodes 121 to control the states of the electrophoretic elements 114. A lower viewing angle control electrode 126 common to a plurality of electrophoretic elements 114 can provide the electrophoretic elements 114 with uniform electric fields, enabling more uniform viewing angle control in the plane.

The viewing angle controllable touch panel 1 includes a viewing angle control layer between the upper glass substrate 112 and the lower glass substrate 111. The viewing angle control layer consists of a plurality of electrophoretic elements 114 and transparent regions 115. The transparent regions 115 are light transmissive regions. The electrophoretic elements 114 and the transparent regions 115 are disposed to lie in the x-axis direction and to be alternate in the y-axis direction.

In the x-y plane, the plurality of electrophoretic elements 114 have a stripe pattern such that they extend in the x-axis direction and they are distant from one another in the y-axis direction. The transparent regions 115 between electrophoretic elements 114 have also a stripe pattern such that they extend in the x-axis direction and they are distant from one another in the y-axis direction. The transparent regions 115 can be made of light transmissive or photosensitive resin, for example. The height of the transparent regions 115 is selected appropriately to the pitches of the transparent regions and electrophoretic elements determined to meet the viewing angle characteristic demanded for the viewing angle controllable touch panel and it can be 10 to 500 μm, for example.

Each electrophoretic element 114 can be separate from the other ones or can be a part of an unseparated region. For example, each electrophoretic element can be a cuboid along the x-axis direction or the y-axis direction in a grid-like region. In this configuration, the transparent regions can be columnar regions separate from one another.

Each electrophoretic element 114 includes electrophoretic particles 140 and a dispersion medium 141 (electrophoretic element material) contained in a space formed between transparent regions 115. In other words, the transparent regions 115 and the electrophoretic elements 114 have a relation of ridges and grooves in a transparent resin block. The electrophoretic particles 140 are colored, for example, in black. The dispersion medium 141 can be a transparent and colorless liquid. The pitch and the width of the electrophoretic elements are selected appropriately to the viewing angle characteristic demanded for the viewing angle controllable touch panel. In the selecting, the pixel layout of the display panel should also be considered to reduce the moire to be generated depending on the relation between the pitch of the lines of the viewing angle controllable touch panel and the pitch of the pixels of the display panel. For example, the width of the electrophoretic elements 114 can be 3 to 100 μm and their pitch can be 3 to 1000 μm.

Each electrophoretic element 114 is sandwiched between one upper touch panel electrode 121 and one lower viewing angle control electrode 126. In the configuration example in FIGS. 2 and 3, each electrophoretic element 114 is sandwiched by a different upper touch panel electrode and the common lower viewing angle control electrode 126.

In the example of FIGS. 2 and 3, the electrophoretic element material composed of electrophoretic particles 140 and the dispersion medium 141 is not in contact with any electrodes and insulating films 131 and 132 are interposed therebetween. That is to say, the insulating films 131 and 132 are exposed to and in direct contact with the electrophoretic element material. However, these insulating films 131 and 132 are optional.

In another configuration example, a plurality of neighboring electrophoretic elements can be sandwiched between one upper touch panel electrode 121 and one lower viewing angle control electrode. That is to say, a plurality of electrophoretic elements can be opposed to one upper touch panel electrode and one lower viewing angle control electrode in the z-axis direction. A plurality of electrophoretic elements are controlled by the electric field by a pair of electrodes.

The viewing angle control layer (active louver) has a large thickness to accomplish its function. Accordingly, the capacitances between the touch panel electrodes 121 and 123 can be made small, improving the sensitivity of the touch sensor. For this reason, the touch sensing is not affected very much even if the space between upper touch panel electrodes 121 and the space between lower touch panel electrodes 123 are reduced. Therefore, a larger number of touch panel electrodes can be disposed to reduce the jitter (instability in sensing).

Figure 4:
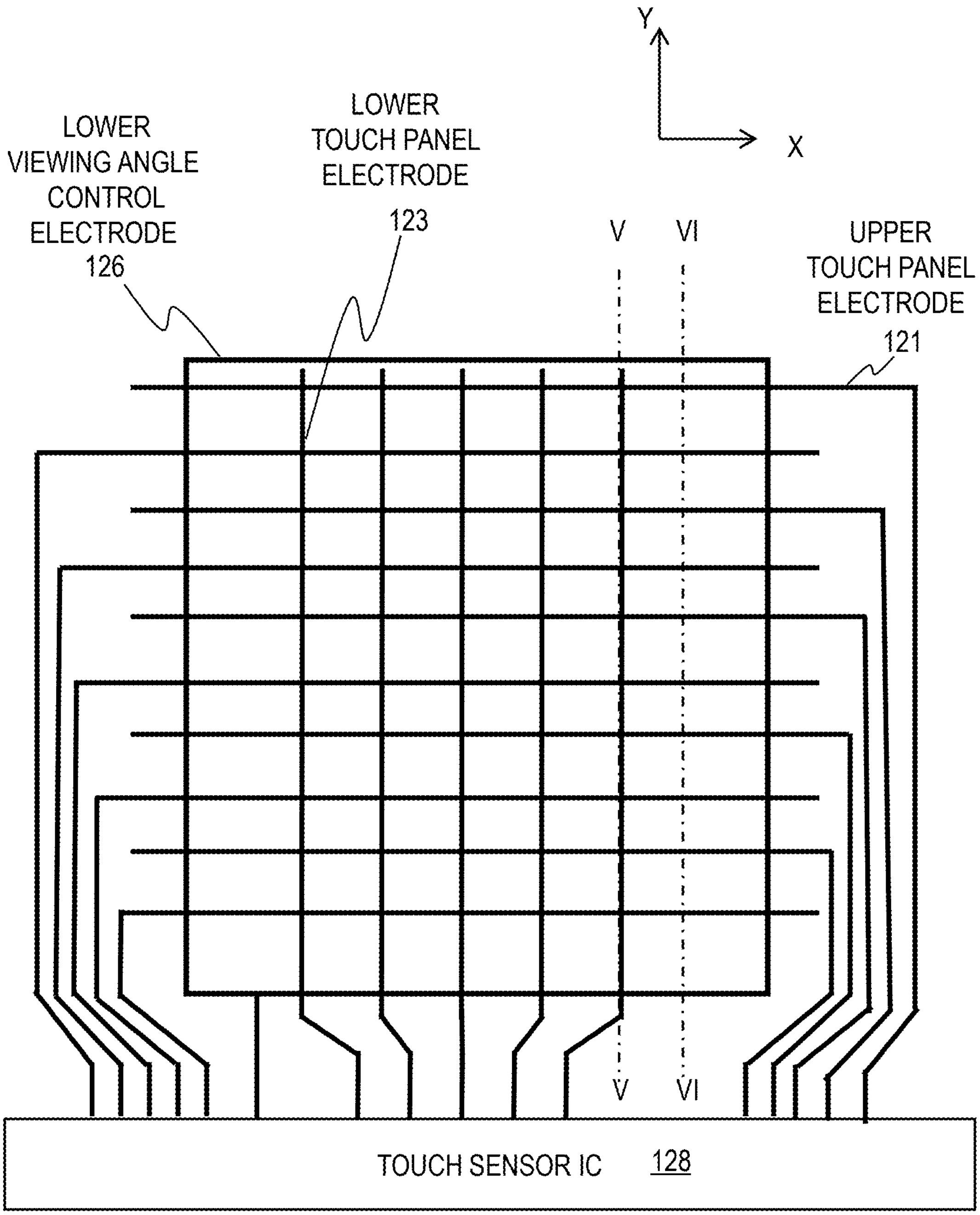
FIG. 4 illustrates an example of the line layout of a viewing angle controllable touch panel.

FIG. 4 illustrates an example of the line layout of the viewing angle controllable touch panel 1. The potentials of the upper touch panel electrodes 121, the lower touch panel electrodes 123, and the lower viewing angle control electrode 126 are controlled by a touch sensor IC 128 of a controller. The touch sensor IC 128 further measures the variations in the capacitances between the upper touch panel electrodes 121 and the lower touch panel electrodes 123 to detect a touch point of a pointer based on the measurement result. The touch sensor IC 128 can be electrically connected to these electrodes 121, 123, and 126 via the FPC 154 and the peripheral lines on the lower glass substrate 111 and the upper glass substrate 112.

The upper touch panel electrodes 121 are X electrodes and they are disposed to extend in the x-axis direction and to be distant from one another in the y-axis direction. The widths of the upper touch panel electrodes 121 and their spacing can be uniform or different. The lower touch panel electrodes 123 are Y electrodes and they are disposed to extend in the y-axis direction and to be distant from one another in the x-axis direction. The widths of the lower touch panel electrodes 123 and their spacing can be uniform or different. The upper touch panel electrodes 121 can have any shape and be disposed in any layout as far as they are appropriate for touch sensing and viewing angle control. The lower touch panel electrodes 123 can also have any shape and be disposed in any layout as far as they are appropriate for touch sensing.

The lower viewing angle control electrode 126 has a sheet-like shape and overlaps the upper touch panel electrodes 121 and the lower touch panel electrodes 123 in a planar view. The upper touch panel electrodes 121 are also upper viewing angle control electrodes. The states of the electrophoretic elements 114 are controlled by the electric fields between the upper touch panel electrodes 121 and the lower viewing angle control electrode 126. Although all upper touch panel electrodes 121 in the example in FIG. 4 are paired with the same lower viewing angle control electrode 126, the upper touch panel electrodes 121 can be divided into a plurality of groups and each group can be paired with a separate lower viewing angle control electrode 126.

Figure 5A:
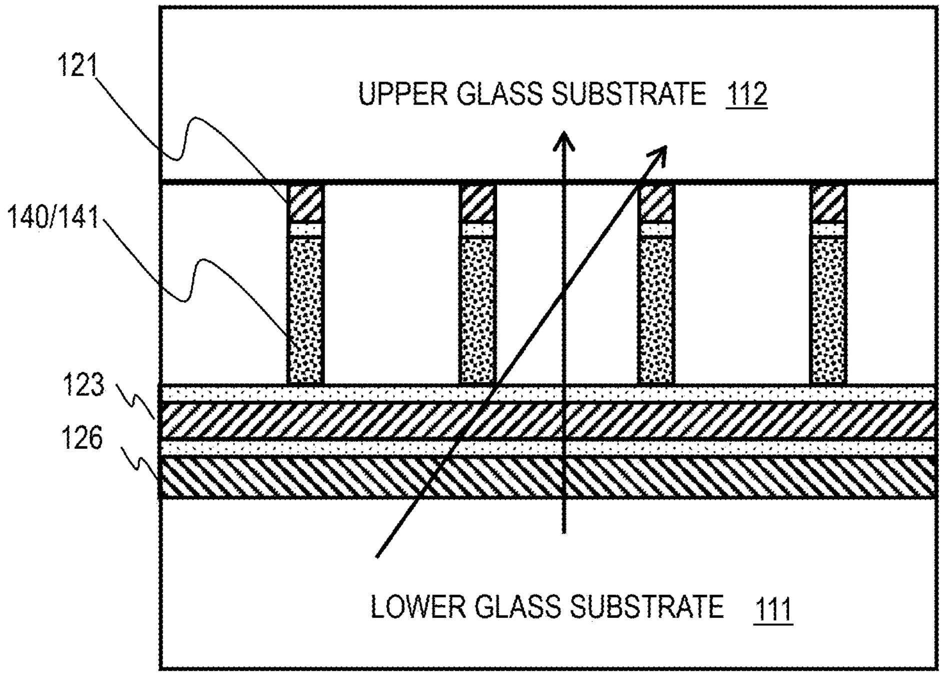
FIG. 5A schematically illustrates a cross-sectional structure of the viewing angle controllable touch panel in a narrow view state along the section line V-V in FIG. 4.
Figure 5B:
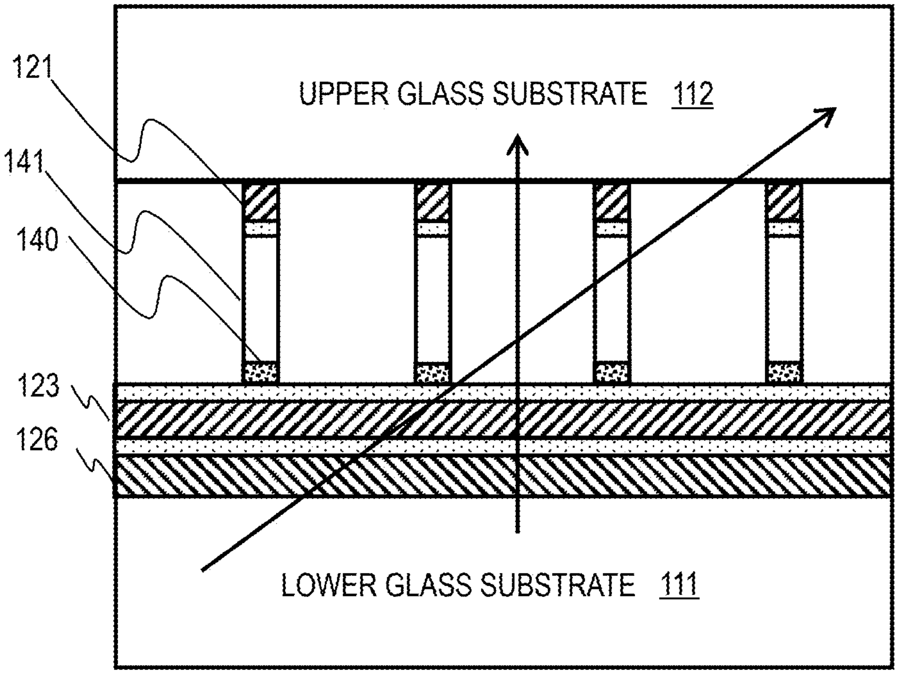
FIG. 5B schematically illustrates a cross-sectional structure of the viewing angle controllable touch panel in a wide view state along the section line V-V in FIG. 4.
Figure 6A:
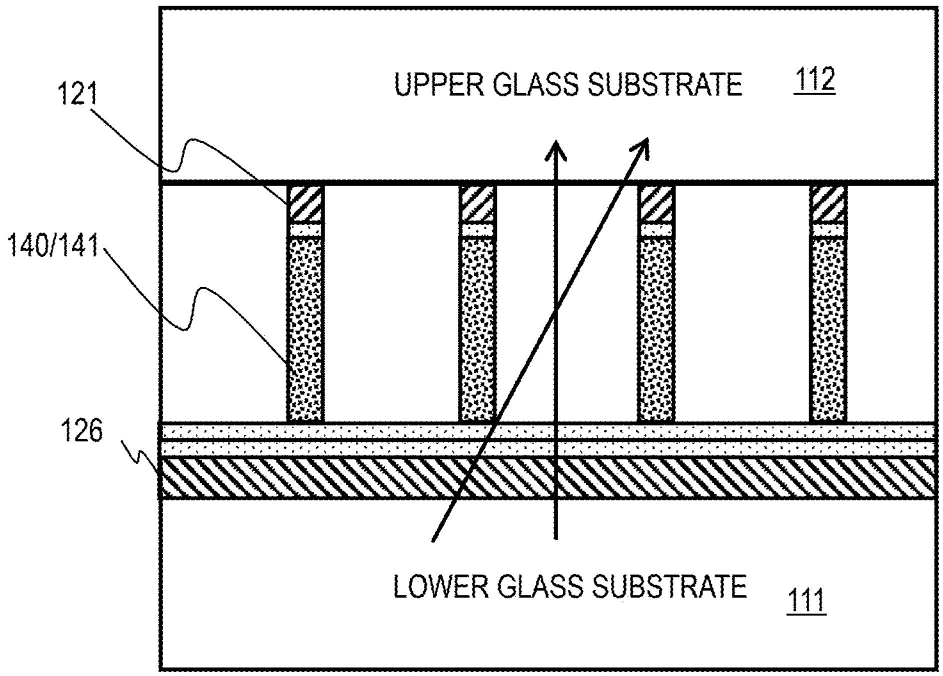
FIG. 6A schematically illustrates a cross-sectional structure of the viewing angle controllable touch panel in a narrow view state along the section line VI-VI in FIG. 4.
Figure 6B:
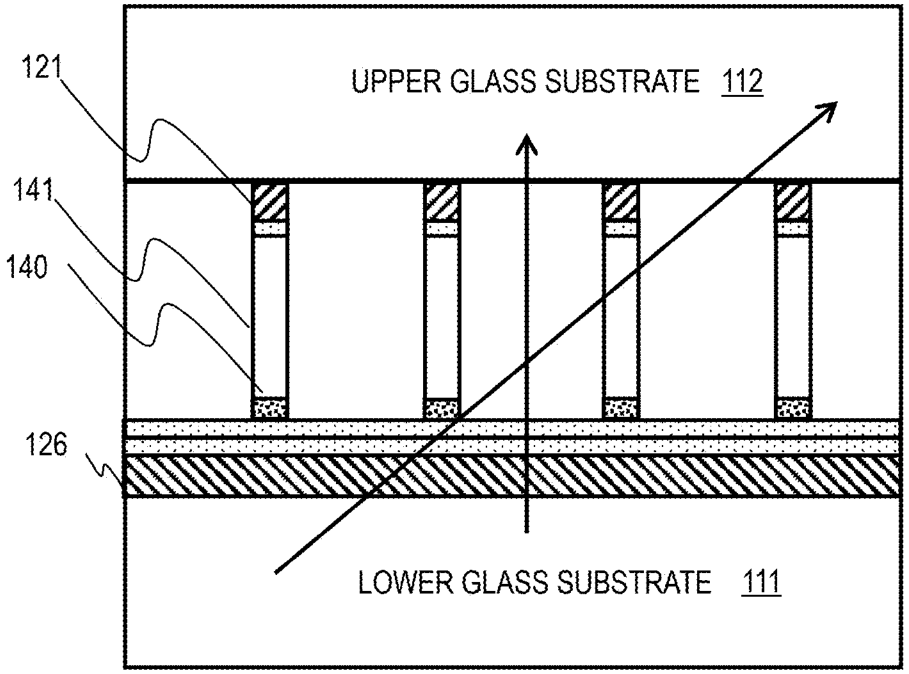
FIG. 6B schematically illustrates a cross-sectional structure of the viewing angle controllable touch panel in a wide view state along the section line VI-VI in FIG. 4.

FIGS. 5A and 5B schematically illustrate a cross-sectional structure of the viewing angle controllable touch panel 1 along the section line V-V in FIG. 4. FIGS. 6A and 6B schematically illustrate a cross-sectional structure of the viewing angle controllable touch panel 1 along the section line VI-VI in FIG. 4. FIGS. 5A and 6A illustrate a narrow view state and FIGS. 5B and 6B illustrate a wide view state.

In the narrow view state illustrated in FIGS. 5A and 6A, the electrophoretic particles 140 in each electrophoretic element 114 are dispersed in the dispersion medium 141. The electrophoretic element 114 blocks light from the display panel 5 by the dispersed electrophoretic particles 140 absorbing the light from the display panel 5. As a result, only the rays of light within an emission angle range narrow in the y-axis direction travel through the viewing angle controllable touch panel 1.

In the narrow view state, the upper touch panel electrode 121 and the lower viewing angle control electrode 126 sandwiching the electrophoretic element 114 are maintained at the same potential. As a result, the electrophoretic particles 140 are kept to be dispersed in the dispersion medium 141. The specifics of the potential control of the upper touch panel electrode 121, the lower touch panel electrodes 123 and the lower viewing angle control electrode 126 will be described later.

FIGS. 5B and 6B illustrate the viewing angle controllable touch panel 1 in a wide view state. The wide view state is attained by gathering the electrophoretic particles 140 in each electrophoretic element 114 to the vicinity of either one of the electrodes sandwiching the electrophoretic element 114, for example, to the vicinity of the lower viewing angle control electrode 126. Most region of the electrophoretic element 114 gets composed of only the transparent dispersion medium 141 to make the electrophoretic element 114 transmissive. As a result, the rays of light within an emission angle range wide in the y-axis direction travel through the viewing angle controllable touch panel 1.

In the wide view state, the relative potential of the lower viewing angle control electrode 126 to the upper touch panel electrodes 121 has the polarity opposite to the charge of the electrophoretic particles 140 (with a potential difference V). As a result, the electrophoretic particles 140 gather to the vicinity of the lower viewing angle control electrode 126. The electrophoretic particles 140 are negatively charged in the example of FIGS. 5B and 6B.

In the case where the electrophoretic particles 140 are charged negatively (−), appropriate potentials are supplied to the lower viewing angle control electrode 126 and the upper touch panel electrodes 121 to make the lower viewing angle control electrode 126 a positive electrode. In the case where the electrophoretic particles 140 are charged positively (+), appropriate potentials are supplied to the lower viewing angle control electrode 126 and the upper touch panel electrodes 121 to make the lower viewing angle control electrode 126 a negative electrode. The sufficient potential difference V is approximately 10 to 30 V, for example.

Figure 7A:
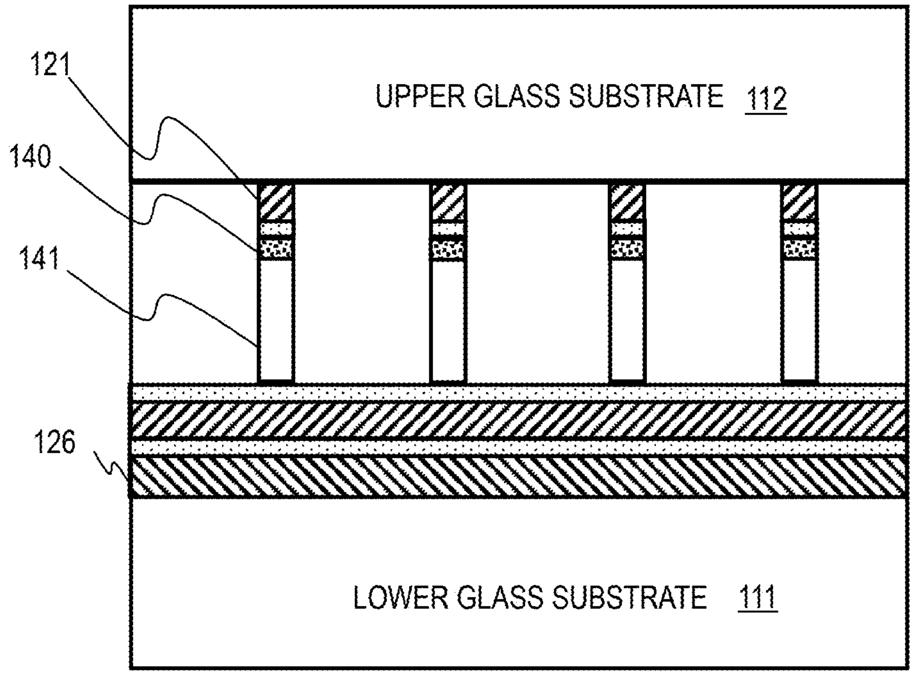
FIG. 7A schematically illustrates another cross-sectional structure of the viewing angle controllable touch panel in a wide view state along the section line V-V in FIG. 4.
Figure 7B:
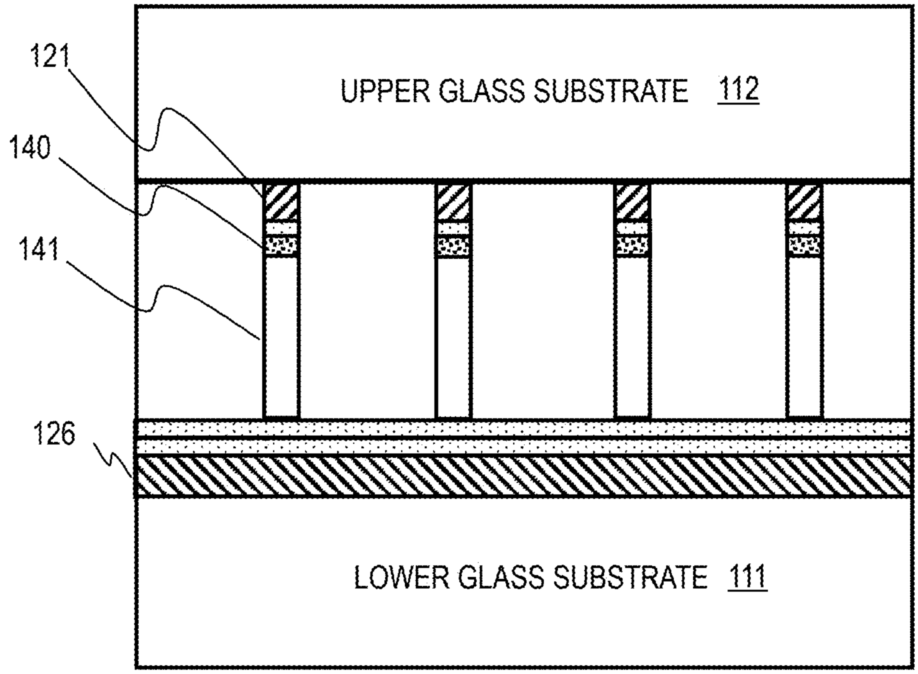
FIG. 7B schematically illustrates another cross-sectional structure of the viewing angle controllable touch panel in a wide view state along the section line VI-VI in FIG. 4.

FIGS. 7A and 7B illustrate another example of the wide view state where the electrophoretic particles 140 are gathered to the vicinity of the upper touch panel electrodes 121. FIG. 7A schematically illustrates the cross-sectional structure along the section line V-V in FIG. 4 and FIG. 7B schematically illustrates the cross-sectional structure along the section line VI-VI in FIG. 4. The electrophoretic particles 140 are charged negatively. The lower viewing angle control electrode 126 and the upper touch panel electrodes 121 are supplied with appropriate potentials to make the lower viewing angle control electrode 126 a negative electrode.

The following description is provided based on an assumption that the electrophoretic particles 140 are negatively charged. In the case where the electrophoretic particles 140 are positively charged, the same control is applicable by changing the polarity of the lower viewing angle control electrode 126 to the opposite one.

The sheet resistances of the insulating films 131, 132, and 133 may affect the touch sensing and the viewing angle control. The inventors' research revealed that more appropriate touch sensing and viewing angle control were both attained when the sheet resistances of those films were from 5E6Ω/□ to 5E8Ω/□. When the sheet resistances were lower than 5E5Ω/□, malfunctions frequently occurred in touch sensing. When the sheet resistances were higher than 5E12Ω/□, viewing angle switching took long time. The appropriate thicknesses of the insulating films are approximately 10 to 100 nm.

The insulating films 131, 132, and 133 covering the touch panel electrodes 121 and 123 and the lower viewing angle control electrode 126 do not have high insulating properties; a certain level of leakage current (soft leakage current) is generated under a high electric field. Since the insulating films keep the upper touch panel electrodes 121 and the lower viewing angle control electrode 126 from direct contact with the electrophoretic particles 140, the electrophoretic particles 140 do not stick to the electrodes.

Since the insulating properties are not high, the electrophoretic particles 140 move without applying a high voltage between the upper touch panel electrodes 121 and the lower viewing angle control electrode 126. Accordingly, the active louver attains high reliability while keeping high responsivity. In addition, the sensitivity of touch sensing can be maintained because the insulating film 133 above the lower viewing angle control electrode 126 prevents the electric fields between the touch panel electrodes 121 and 123 from being affected by the potential of the lower viewing angle control electrode 126.

Figure 8A:
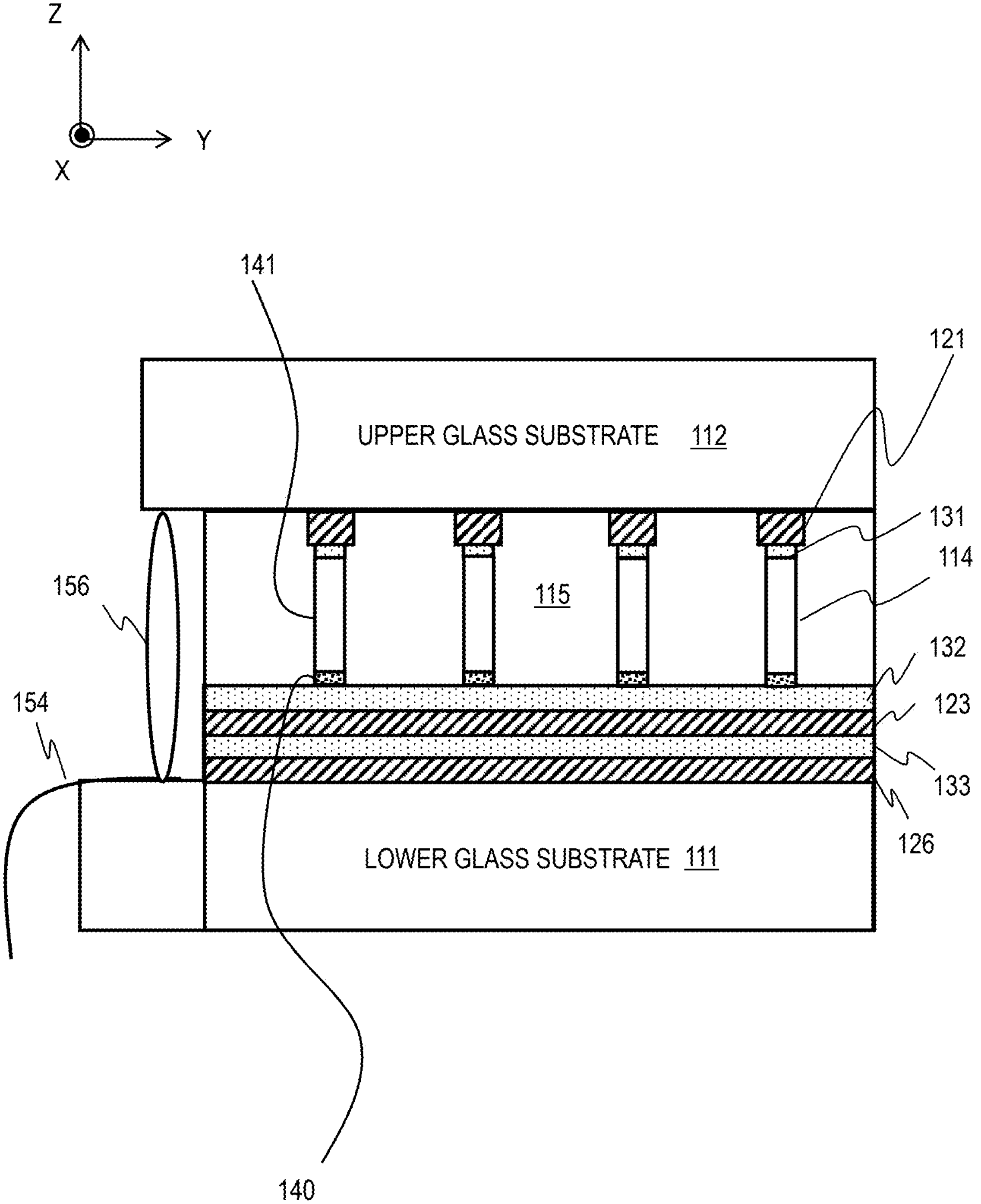
FIG. 8A illustrates another structural example of the viewing angle controllable touch panel.

FIG. 8A illustrates another structural example of the viewing angle controllable touch panel 1. The structural example in FIG. 8A includes upper touch panel electrodes 121 having a wider width than the electrophoretic elements (light blocking regions) 114.

Figure 8B:
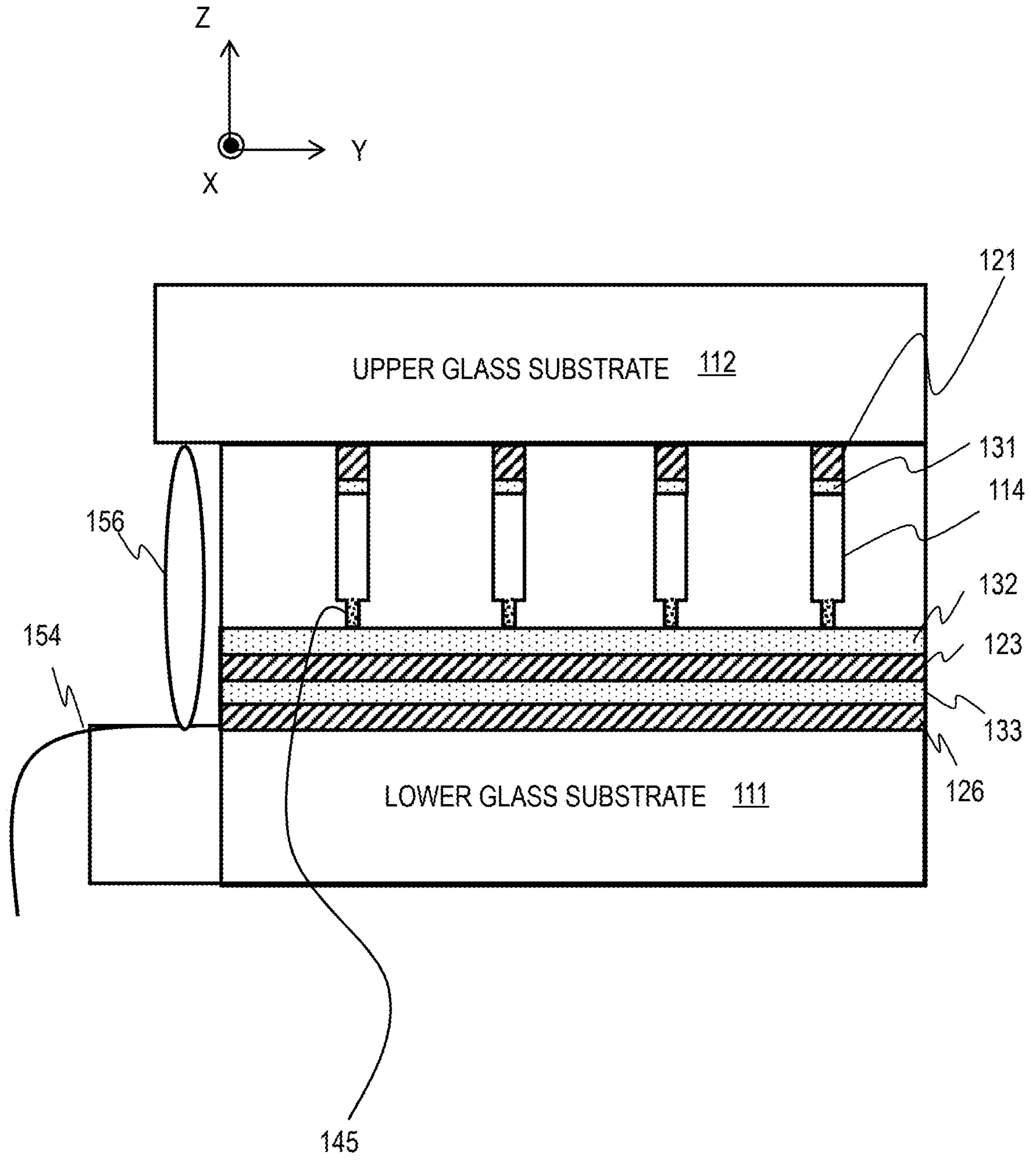
FIG. 8B illustrates an electrophoretic element having another shape.

FIG. 8B illustrates an electrophoretic element 114 having another shape. The region 145 where electrophoretic particles 140 are gathered can have a narrower width than the other region. In the example of FIG. 8B, the end region close to the lower viewing angle control electrode 126 has a narrower width than the region upper than that. In the case where the electrophoretic particles 140 are gathered to the vicinity of the upper touch panel electrode 121, the region has a narrower width than the region lower than that. These configurations provide higher transmissivity to the viewing angle controllable touch panel in the narrow view mode.

Figure 9:
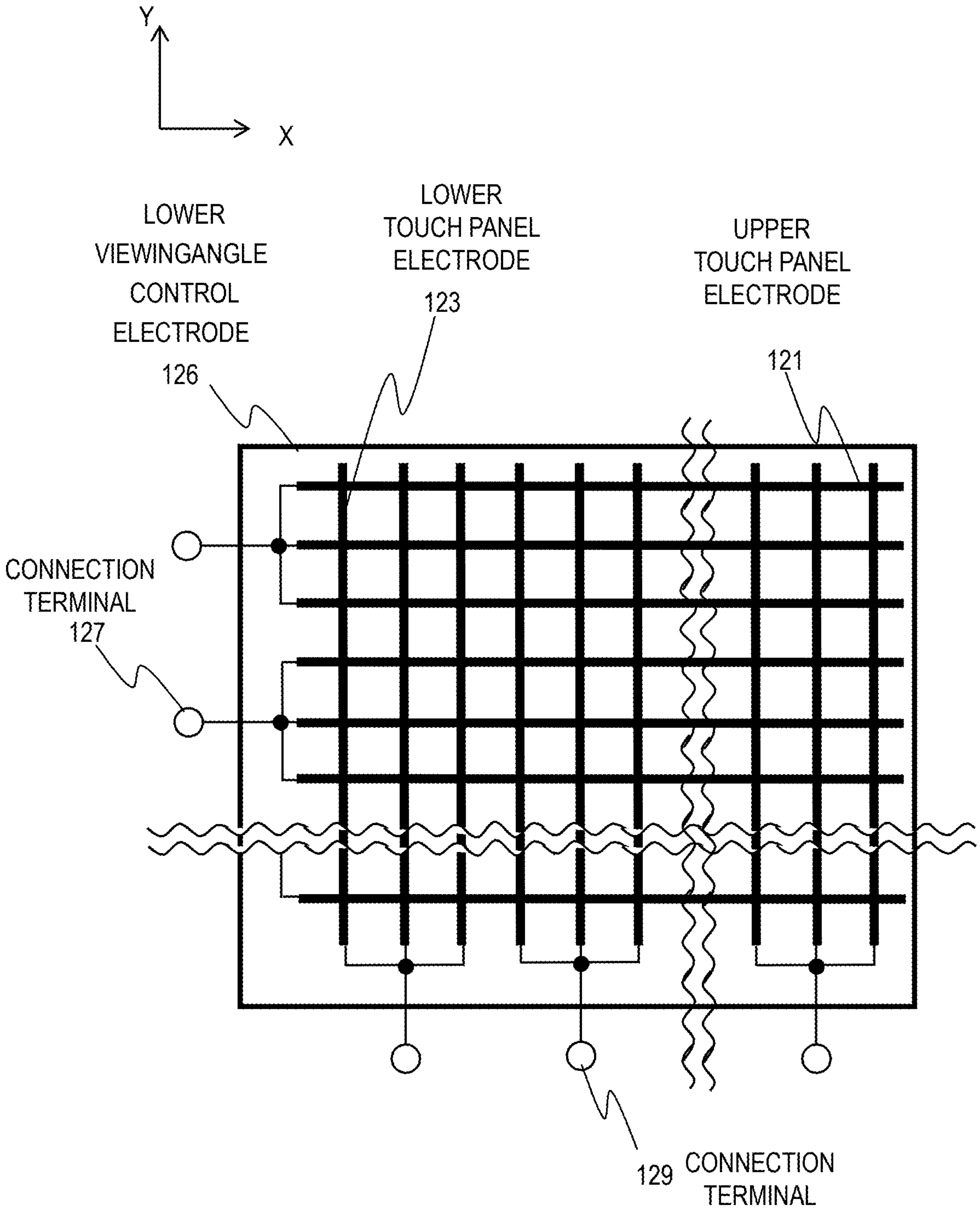
FIG. 9 illustrates a configuration example of a touch panel electrode group obtained by bundling some neighboring touch panel electrodes.

FIG. 9 illustrates a configuration example of a touch panel electrode group obtained by bundling some neighboring touch panel electrodes. The dimension of each electrophoretic element 114 and the space between electrophoretic elements 114 are designed in view of the viewing angle characteristic required for the active louver. In general, the dimension of the electrophoretic element 114 is approximately 3 to 100 μm. The space between electrodes required for touch sensing is approximately 2 to 5 mm. The number of electrodes required for each function is different. Specifically, the active louver requires a larger number of electrodes than the touch panel.

In an embodiment of this specification, the upper touch panel electrodes 121 are shared by the touch sensor and the active louver. For this reason, upper touch panel electrode groups as many as the electrodes required for the touch sensor are configured by bundling a plurality of neighboring upper touch panel electrodes 121 together and those groups are each connected to a connection terminal 127. The electrodes in one upper touch panel electrode group are supplied with the same potential and one signal is sent from one upper touch panel electrode group to the touch sensor IC 128.

In the configuration example in FIG. 9, lower touch panel electrode groups are also configured by bundling a plurality of neighboring lower touch panel electrodes 123 and those groups are each connected to a connection terminal 129. The electrodes in one lower touch panel electrode group are supplied with the same potential and one signal is sent from one lower touch panel electrode group to the touch sensor IC 128. The lower touch panel electrode group can be replaced with a single band-like lower touch panel electrode.

Figure 10:
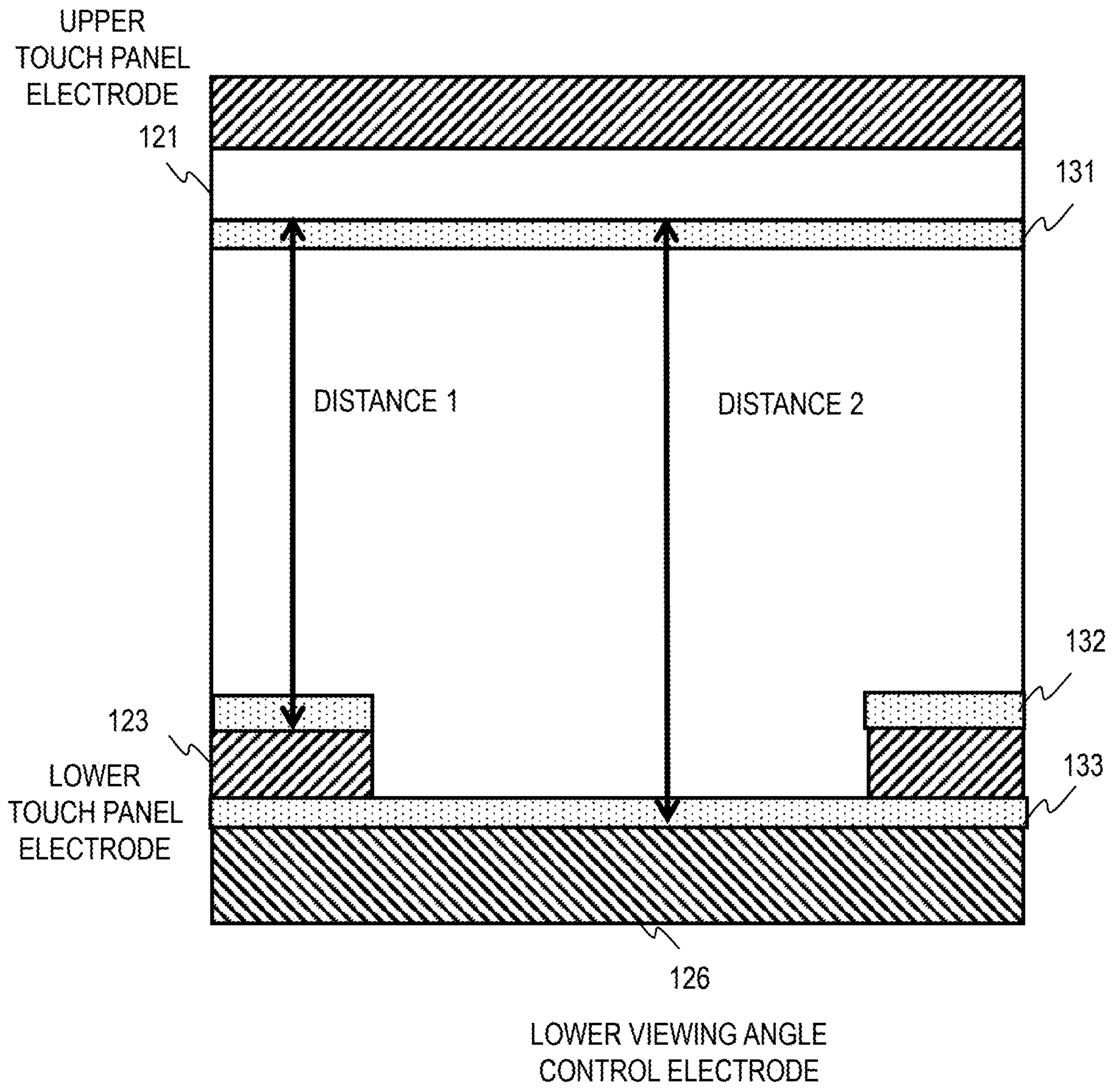
FIG. 10 illustrates the relation between the distance between an upper touch panel electrode and a lower touch panel electrode and the distance between the upper touch panel electrode and a lower viewing angle control electrode.

Hereinafter, control of the viewing angle controllable touch panel 1 is described. As described above, the viewing angle controllable touch panel 1 has a viewing angle control function in addition to a touch panel function. FIG. 10 illustrates the relation between the distance 1 between an upper touch panel electrode 121 and a lower touch panel electrode 123 and the distance 2 between the upper touch panel electrode 121 and the lower viewing angle control electrode 126.

In this structure, the distance 1 between an upper touch panel electrode 121 and a lower touch panel electrode 123 and the distance 2 between the upper touch panel electrode 121 and the lower viewing angle control electrode 126 are different in length. Specifically, the distance 2 is longer than the distance 1.

In the case where the touch sensing period (the period where a voltage is applied between the touch panel electrodes 121 and 123) is long, the electric fields are different between the region sandwiched by the touch panel electrodes 121 and 123 and the region sandwiched by the upper touch panel electrode 121 and the lower viewing angle control electrode 126 and moreover, electrophoretic particles 140 move differently between the region above the lower touch panel electrode 123 and the other region (the region above the lower viewing angle control electrode 126). This difference in movement of electrophoretic particles 140 could be recognized as display unevenness.

An embodiment of this specification includes a sensing period for touch sensing and a non-sensing period in one frame period. The touch sensor IC 128 supplies signals for touch sensing to the upper touch panel electrodes 121, the lower touch panel electrodes 123, and the lower viewing angle control electrode 126 in the sensing period. The touch sensor IC 128 supplies signals for viewing angle control to the upper touch panel electrodes 121, the lower touch panel electrodes 123, and the lower viewing angle control electrode 126 in the non-sensing period.

An embodiment of this specification provides a non-sensing period longer than a sensing period. As a result, the effect of the electric fields between touch panel electrodes onto the electrophoretic particles 140 (the recognition of display unevenness) in touch sensing reduces.

Description about capacitive touch sensors is now provided. There are two schemes for the capacitive sensing: self-capacitive sensing and mutual capacitive sensing. A self-capacitive touch sensor has a plurality of X electrodes and a plurality of Y electrodes. The X electrodes and the Y electrodes are disposed in a matrix with an insulator interposed therebetween. The self-capacitive touch sensor drives the X electrodes and the Y electrodes independently to detect a change in capacitance at an electrode. When a pointer approaches an electrode, the capacitance of the electrode increases. Self-capacitive sensing detects an X electrode and a Y electrode where the capacitance has increased to detect the position of the pointer.

A mutual capacitive touch panel has transmitter electrodes (for example, Y electrodes) as driver electrodes and receiver electrodes (for example, X electrodes) as sensor electrodes. The driver electrodes and the sensor electrodes are disposed in a matrix with an insulator interposed therebetween. A capacitor (intersection capacitor) is configured at every intersection of a driver electrode and a sensor electrode. When a pointer approaches an intersection capacitor, a part of the electric field at the intersection moves toward the pointer and the capacitance at the intersection decreases. Mutual capacitive sensing detects at which intersection and how big the change in mutual capacitance occurs to detect the position of the pointer. The following description is provided using the mutual capacitive sensing as an example.

Figure 11:
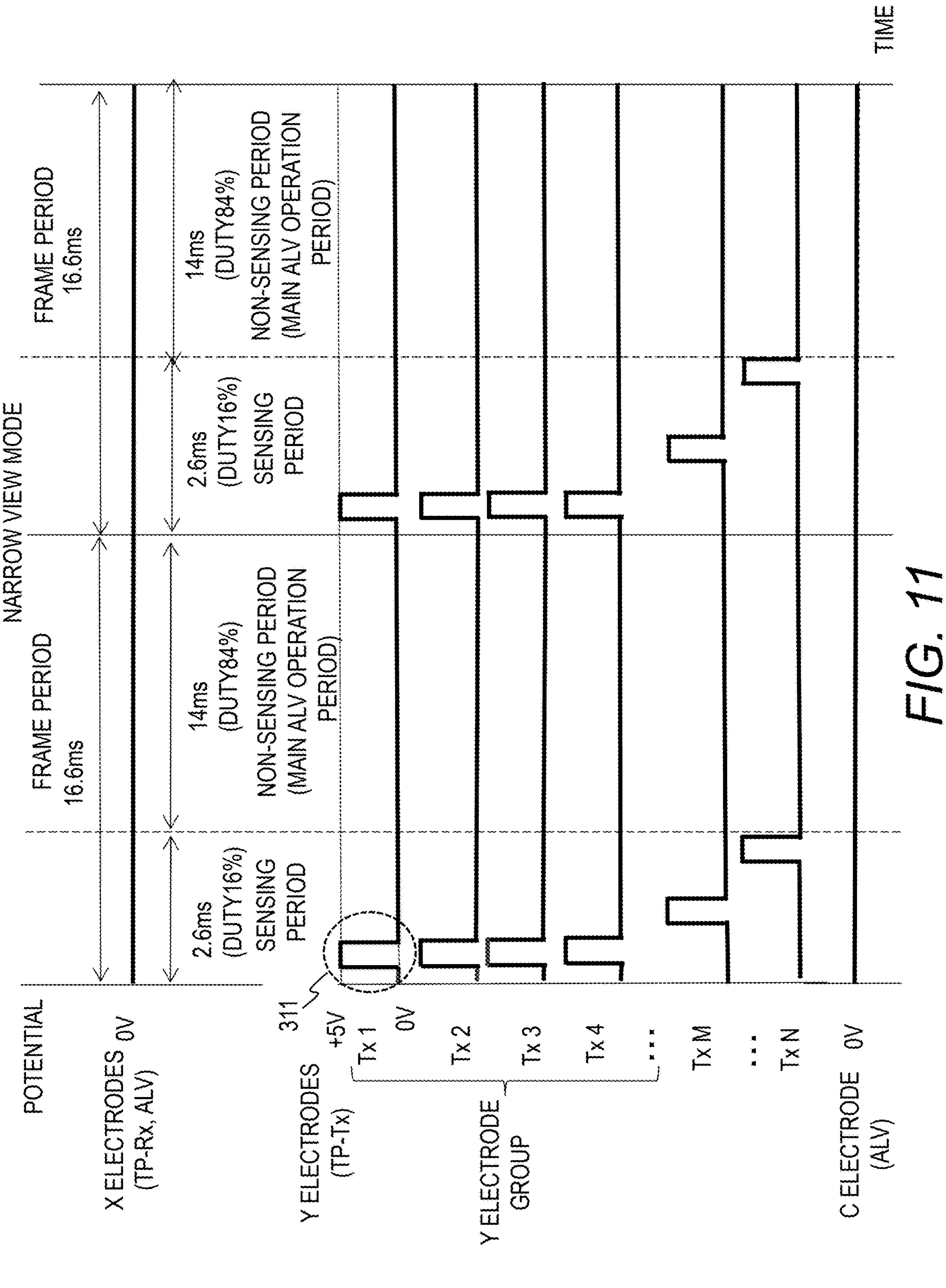
FIG. 11 is a timing chart illustrating an example of temporal variation of the potentials of the upper touch panel electrodes (X electrodes), the lower touch panel electrodes (Y electrodes), and the lower viewing angle control electrode (C electrode) in a narrow view mode.

FIG. 11 is a timing chart illustrating an example of temporal variation of the potentials of the upper touch panel electrodes (X electrodes) 121, the lower touch panel electrodes (Y electrodes) 123, and the lower viewing angle control electrode (C electrode) 126 in a narrow view mode. The example in FIG. 11 includes N (N is a natural number) Y electrodes.

The upper touch panel electrodes 121 are X electrodes, which are the receiver electrodes of the touch sensor (TP-Rx) and also control electrodes of the viewing angle control device (ALV). The lower touch panel electrodes 123 are Y electrodes, which are the transmitter electrodes of the touch sensor (TP-Tx). The lower viewing angle control electrode 126 is a C electrode, which is another control electrode of the viewing angle control device (ALV). The upper touch panel electrodes 121 can be transmitter electrodes and the lower touch panel electrodes 123 can be receiver electrodes.

The frame frequency in the example of FIG. 11 is assumed to be 60 fps. One frame period is separated into a sensing period and a non-sensing period (main ALV operation period). Although the non-sensing period in the example of FIG. 11 follows the sensing period, this order can be reversed. The sensing period is 2.6 ms and the non-sensing period is 14 ms. The sensing period and the non-sensing period are repeated alternately for successive frames.

The Y electrodes are divided into a plurality of Y electrode groups and each Y electrode group consists of a plurality of Y electrodes bundled together. All Y electrodes in a Y electrode group are connected to the same connection terminal. Assume that all Y electrode groups in this example consist of the same number (e.g., 100) of Y electrodes. In similar, the X electrodes are divided into a plurality of X electrode groups and each X electrode group consists of a plurality of X electrodes bundled together.

During a sensing period, the touch sensor IC 128 supplies all X electrodes with a constant potential, which is 0 V in this example. This 0 V can be a system ground potential. Furthermore, the touch sensor IC 128 selects the Y electrode groups one by one and supplies the selected group with a driving pulse 311. The potential of the driving pulse is +5 V. The potentials of the unselected Y electrodes or the Y electrodes not being supplied with a driving pulse are 0 V. The Y electrodes in the same Y electrode group are supplied with the same driving pulse 311. The touch sensor IC 128 supplies the lower viewing angle control electrode (C electrode) 126 with the same potential as the X electrodes, which is 0 V in this example.

During a non-sensing period, the touch sensor IC 128 supplies all X electrodes with a constant potential, which is 0 V in this example. Furthermore, the touch sensor IC 128 supplies all Y electrode groups (all Y electrodes) with 0 V. Since supplying driving pulses to the Y electrodes in a sensing period is completed, all Y electrodes are kept at 0 V when entering the non-sensing period from the sensing period. The touch sensor IC 128 supplies the lower viewing angle control electrode (C electrode) 126 with the same potential as the X electrodes, which is 0 V in this example. Throughout the sensing period and the non-sensing period, the lower viewing angle control electrode (C electrode) 126 is kept at 0 V.

In all periods, the X electrodes of the upper touch panel electrodes 121 and the C electrode of the lower viewing angle control electrode 126 are supplied with the same potential. Accordingly, the electrophoretic particles 140 are dispersed in the electrophoretic elements 114 to block the light from the display panel 5. This means that the viewing angle controllable touch panel 1 is in a narrow view state.

Figure 12:
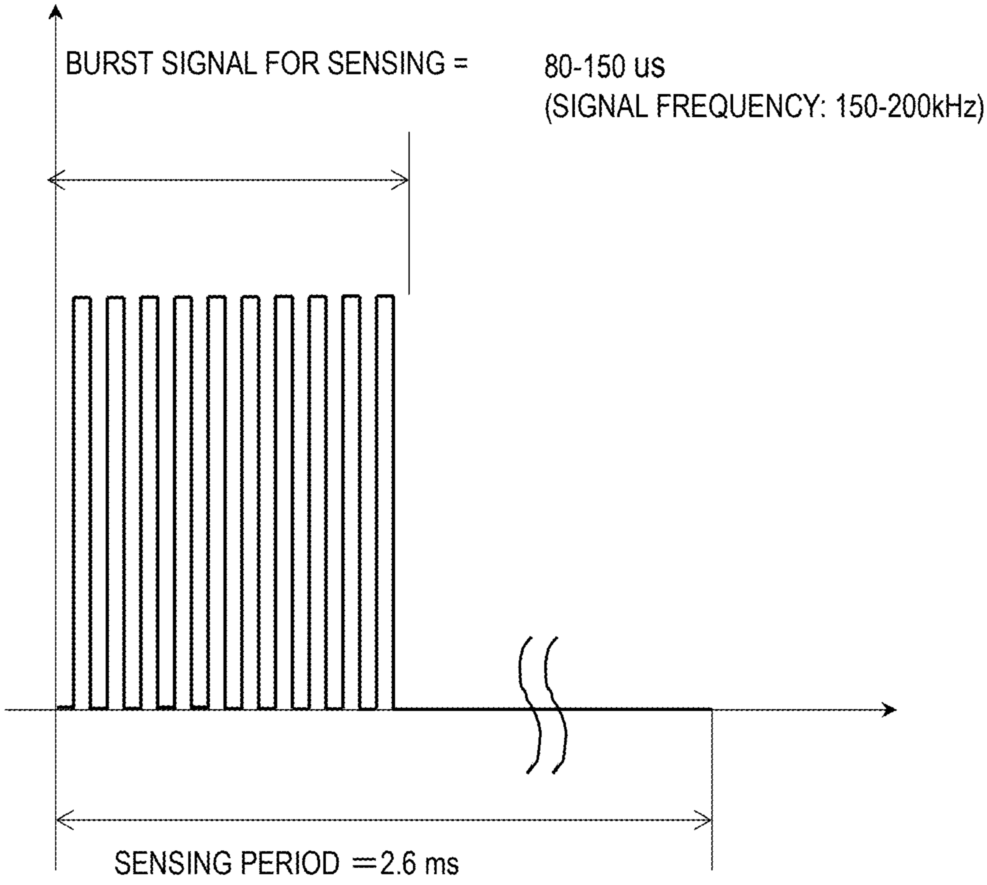
FIG. 12 illustrates the specifics of a driving pulse for touch sensing.

FIG. 12 illustrates the specifics of a driving pulse 311 for touch sensing. The driving pulse 311 is a burst signal and consists of a plurality of successive pulses. In the example in FIG. 12, the period of the burst signal is 80 to 150 μs and its frequency is 150 to 200 kHz. A sensing period is 2.6 ms as described above. The period and the frequency of the burst signal can be determined desirably.

Figure 13:
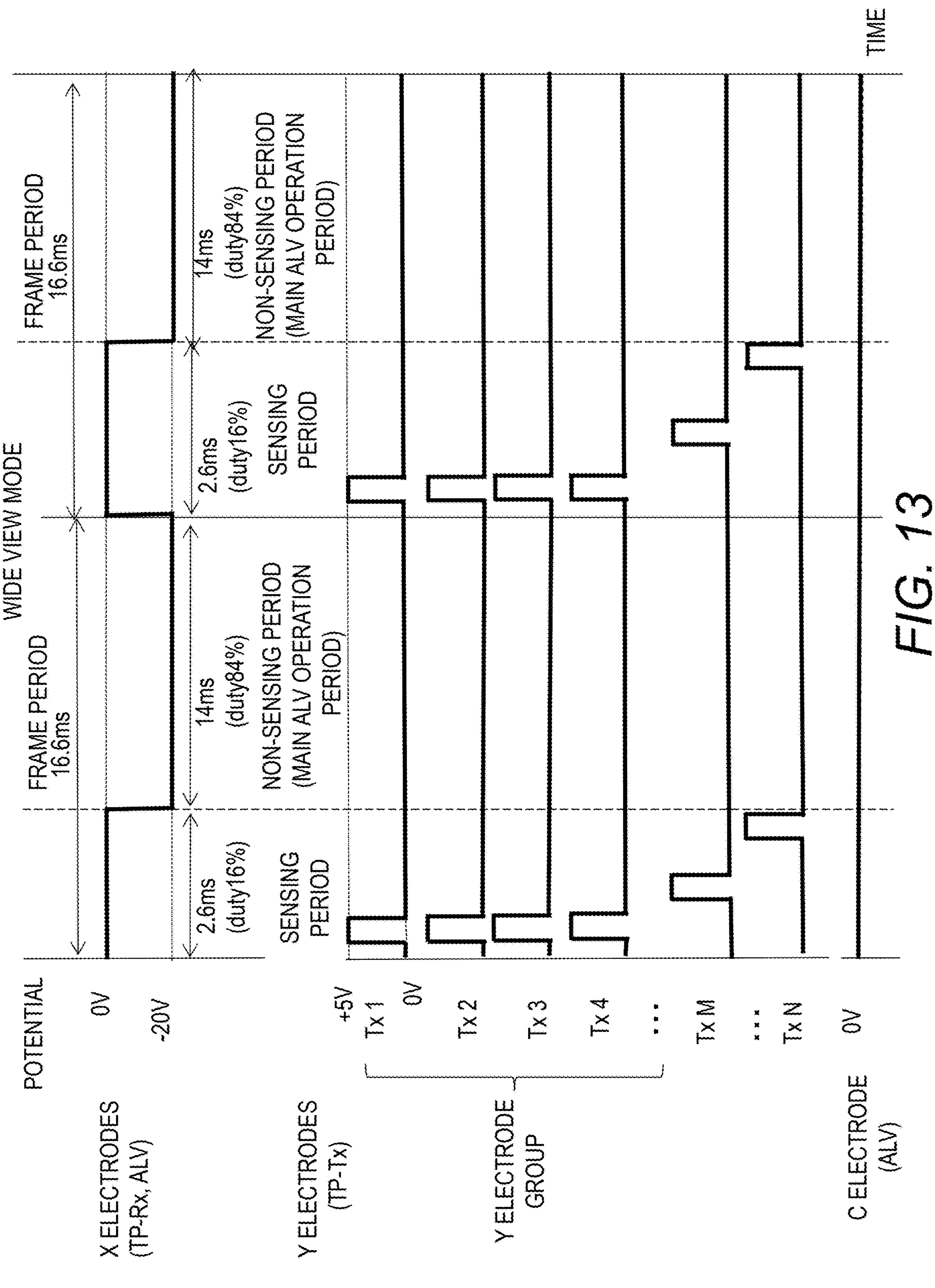
FIG. 13 is a timing chart illustrating an example of temporal variation of the potentials of the upper touch panel electrodes (X electrodes), the lower touch panel electrodes (Y electrodes), and the lower viewing angle control electrode (C electrode) in a wide view mode.

FIG. 13 is a timing chart illustrating an example of temporal variation of the potentials of the upper touch panel electrodes (X electrodes) 121, the lower touch panel electrodes (Y electrodes) 123, and the lower viewing angle control electrode (C electrode) 126 in a wide view mode. Compared to the timing chart described with reference to FIG. 11, the potential variation of the X electrodes (upper touch panel electrodes 121) is different. Specifically, the potentials of the X electrodes in a non-sensing period are −20 V. The potentials of the X electrodes in a sensing period are 0 V, which is the same as those in the narrow view state, and the temporal variation in the potentials of the other electrodes (the signals therefor) are the same as those in the narrow view state.

During a non-sensing period, the X electrodes or the upper touch panel electrodes (upper viewing angle control electrodes) 121 are supplied with −20 V and the C electrode or the lower viewing angle control electrode 126 is supplied with 0 V. Accordingly, the negatively charged electrophoretic particles 140 are gathered to the regions closer to the lower viewing angle control electrode 126. This means that the viewing angle controllable touch panel 1 is in a wide view state.

Figure 14:
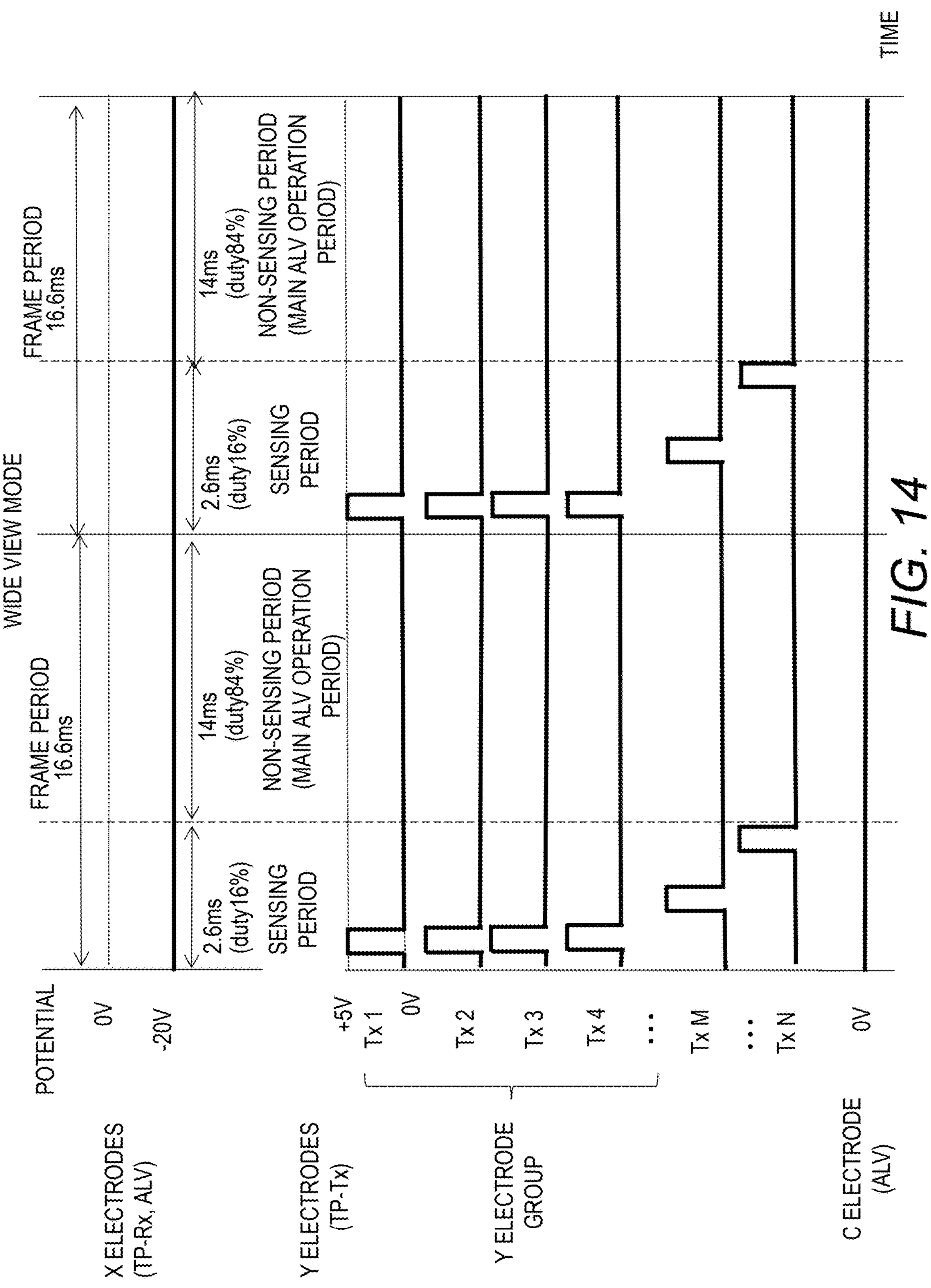
FIG. 14 is a timing chart illustrating another example of temporal variation of the potentials of the upper touch panel electrodes (X electrodes), the lower touch panel electrodes (Y electrodes), and the lower viewing angle control electrode (C electrode) in a wide view mode.

FIG. 14 is a timing chart illustrating another example of temporal variation of the potentials of the upper touch panel electrodes (X electrodes) 121, the lower touch panel electrodes (Y electrodes) 123, and the lower viewing angle control electrode (C electrode) 126 in a wide view mode. Compared to the timing chart described with reference to FIG. 13, the potentials of the X electrodes (upper touch panel electrodes 121) in a sensing period are different. Specifically, the X electrodes are supplied with the same −20 V as the one in a non-sensing period. From the standpoint of touch sensing, 0 V is more preferable than −20 V for the potentials of the X electrodes in a sensing period; however, the example in FIG. 14 can keep the X electrodes at a constant potential.

In the examples described with reference to FIGS. 11 to 14, the potential of the lower viewing angle control electrode 126 is fixed. This configuration facilitates the control of the active louver.

According to the control described with reference to FIGS. 11 to 14, one frame period is separated into a sensing period and a non-sensing period and the non-sensing period is longer than the sensing period. The non-sensing period occupies 84% of one frame and the sensing period occupies 16%. This configuration reduces the effect of the electric fields between touch panel electrodes onto the electrophoretic particles 140 (recognition of display unevenness) during touch sensing.

The duty ratio of the sensing period to the non-sensing period is not limited to the above example.

The behavior of an electrophoretic particle is described. The distance s traveled by an electrophoretic particle when an electric field E is applied for an application time t can be expressed as follows:

$$s = v \cdot t\,(v\text{: velocity})$$

$$v = \mu \cdot E\,(\mu\text{: mobility})$$

The mobility of a spherical electrophoretic particle can be expressed as follows:

$$\mu = q/(6\pi \cdot \eta \cdot \alpha),$$

where q is the charge amount, η is the viscosity of the medium, and α is the diameter of the particle.

From the foregoing expressions, the distance s traveled by an electrophoretic particle can be expressed as follows:

$$S = v \cdot t = qEt/6\pi \cdot \eta \cdot \alpha).$$

This expression indicates that the electrophoretic particle supplied with a stronger electric field or supplied with a voltage for a longer time travels more among equally charged electrophoretic particles. Providing non-sensing periods longer than the sensing periods between these periods continuing alternately as described above makes the electrophoretic particles travel more to reduce the occurrence of display unevenness.

The electrophoretic particles 140 have difficulties in following a change of the voltage in a short time and in moving under a weak electric field. The electrophoretic particles 140 gradually move in the period where a voltage is being applied between the upper touch panel electrodes (X electrodes) 121 and the lower viewing angle control electrode (C electrode) 126. The electrophoretic particles change their state from a dispersed state to a gathered state and from a gathered state to a dispersed state across a plurality of frame periods. In view of this characteristic, the driving method having a short touch sensing period enables more appropriate viewing angle switching without affecting the touch sensing.

Neither the sensing periods nor the non-sensing periods need to be constant. However, constant sensing periods and non-sensing periods facilitate the touch sensing and the viewing angle control.

Figure 15A:
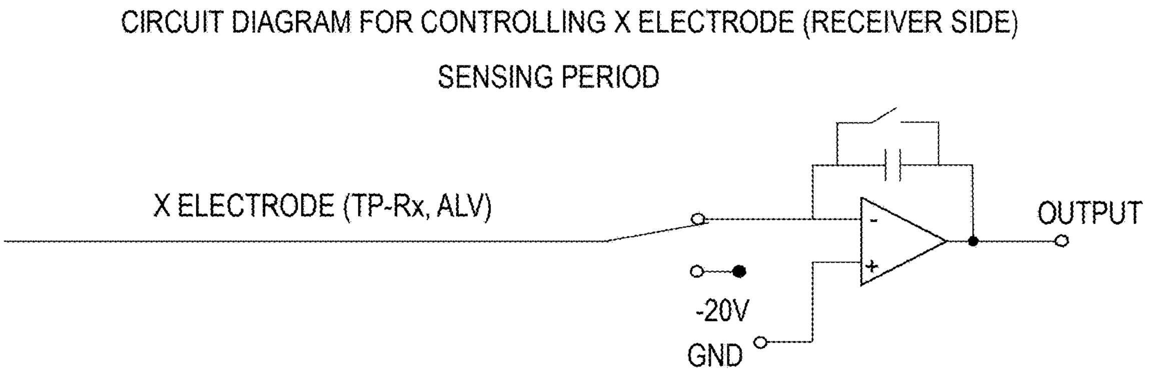
FIG. 15A illustrates a configuration example of a receiver circuit for an X electrode included in a touch sensor IC and its operation.
Figure 15B:
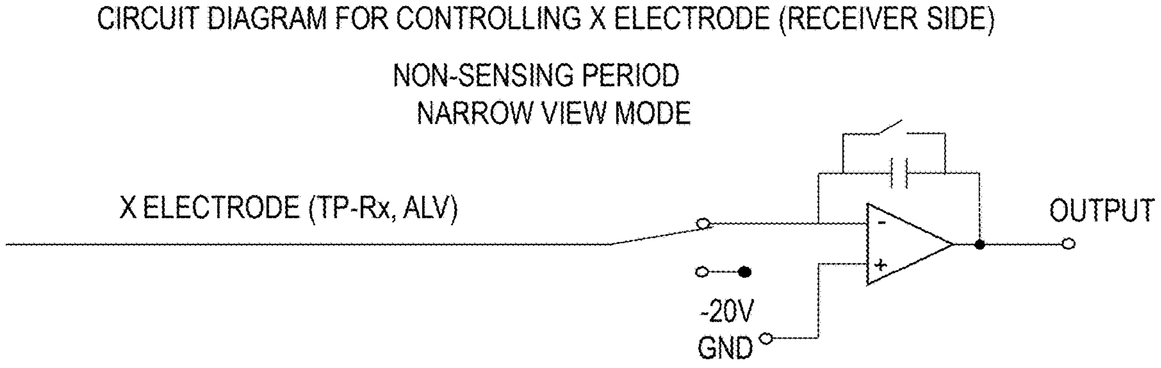
FIG. 15B illustrates a configuration example of a receiver circuit for an X electrode included in a touch sensor IC and its operation.
Figure 15C:
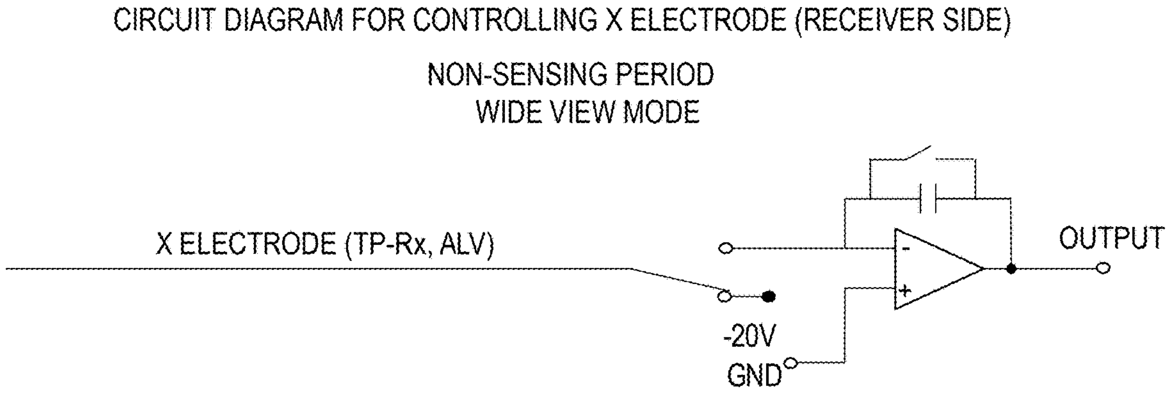
FIG. 15C illustrates a configuration example of a receiver circuit for an X electrode included in a touch sensor IC and its operation.

FIGS. 15A to 15C illustrate a configuration example of a receiver circuit for an X electrode (upper touch panel electrode 121) included in the touch sensor IC 128 and its operation. FIGS. 15A to 15C each correspond to a state in the operation described with reference to FIGS. 11 and 13. FIG. 15A illustrates the state in a sensing period. FIG. 15B illustrates the state in a non-sensing period in a narrow view mode. FIG. 15C illustrates the state in a non-sensing period in a wide view mode.

Figure 16:
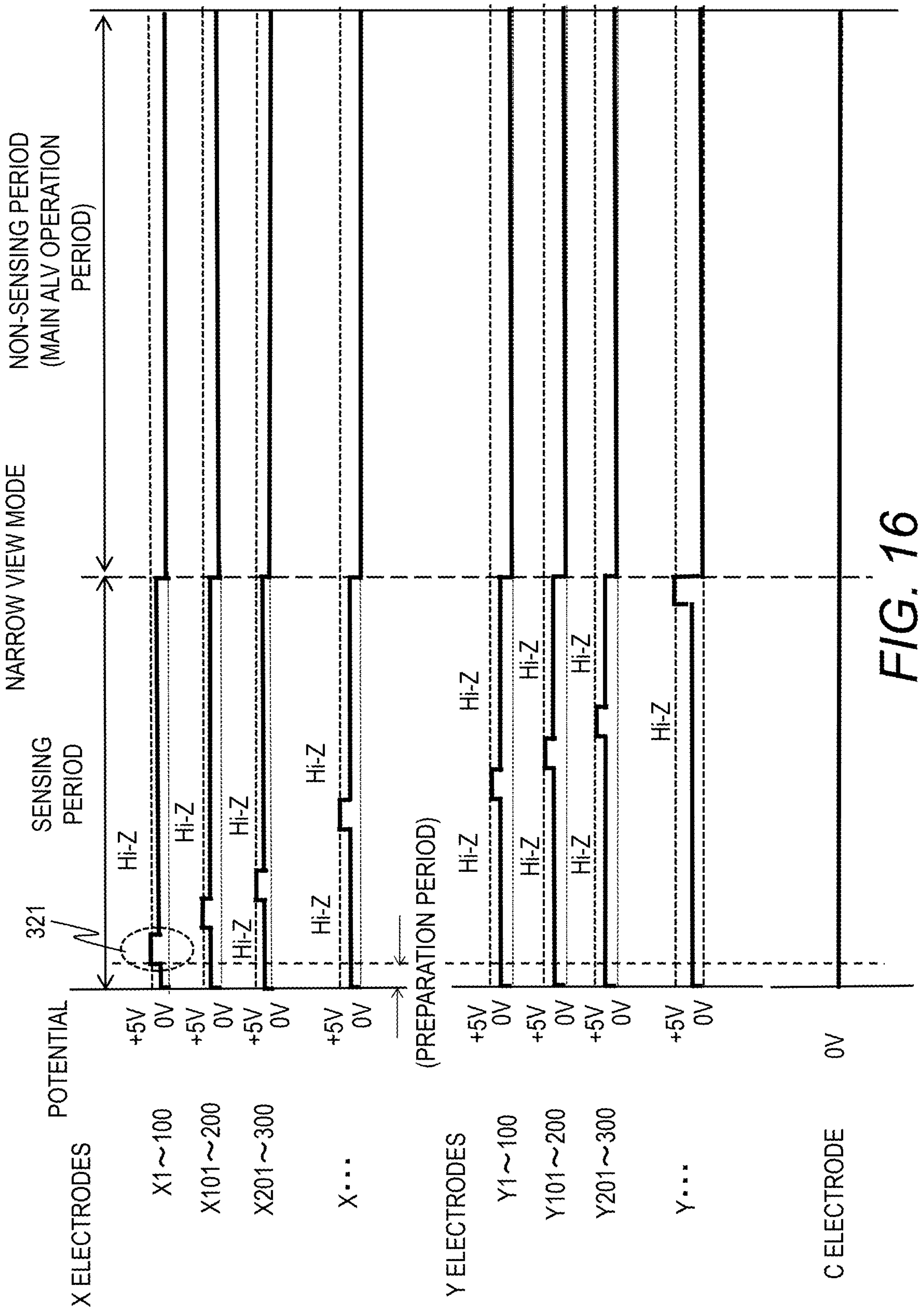
FIG. 16 is a timing chart illustrating still another example of temporal variation of the potentials of the upper touch panel electrodes (X electrodes), the lower touch panel electrodes (Y electrodes), and the lower viewing angle control electrode (C electrode) in a narrow view mode.

Next, examples in the case of self-capacitive touch sensing are described. FIG. 16 is a timing chart illustrating an example of temporal variation of the potentials of the upper touch panel electrodes (X electrodes) 121, the lower touch panel electrodes (Y electrodes) 123, and the lower viewing angle control electrode (C electrode) 126 in a narrow view mode. The X electrodes are divided into groups of 100 electrodes and the Y electrodes are also divided into groups of 100 electrodes.

Like in the timing chart of a narrow view mode of the mutual capacitive touch sensing in FIG. 11, the touch sensor IC 128 separates one frame period into a sensing period and a non-sensing period. The non-sensing period is longer than the sensing period.

The sensing period includes a predetermined length of preparation period from the beginning of the sensing period. In the preparation period provided in the sensing period, the touch sensor IC 128 puts all X electrodes and Y electrodes in high-impedance states. As a result, cross-talk and residual signals from the previous scanning can be avoided.

Subsequently, the touch sensor IC 128 selects the X electrode groups and the Y electrode groups one by one and applies a sensing pulse voltage 321 (+5 V in FIG. 16) to measure the capacitance. The sensing pulse voltage 321 can be a burst signal. In applying the sensing pulse voltage 321, the touch sensor IC 128 maintains the unselected X electrodes and Y electrodes in high impedance states. Putting the unselected X electrodes and Y electrodes in high-impedance states reduces unnecessary current that flows in the parasitic capacitors. The touch sensor IC 128 supplies the C electrode with 0 V (or the system ground potential) during the sensing period.

During a non-sensing period, the touch sensor IC 128 supplies all the X electrodes, Y electrodes, and C electrode with 0 V (or the system ground potential). Since the X electrodes and the C electrode are at the same potential, the electrophoretic particles 140 are in a dispersed state. This means that the viewing angle controllable touch panel 1 is in a narrow view state.

Figure 17:
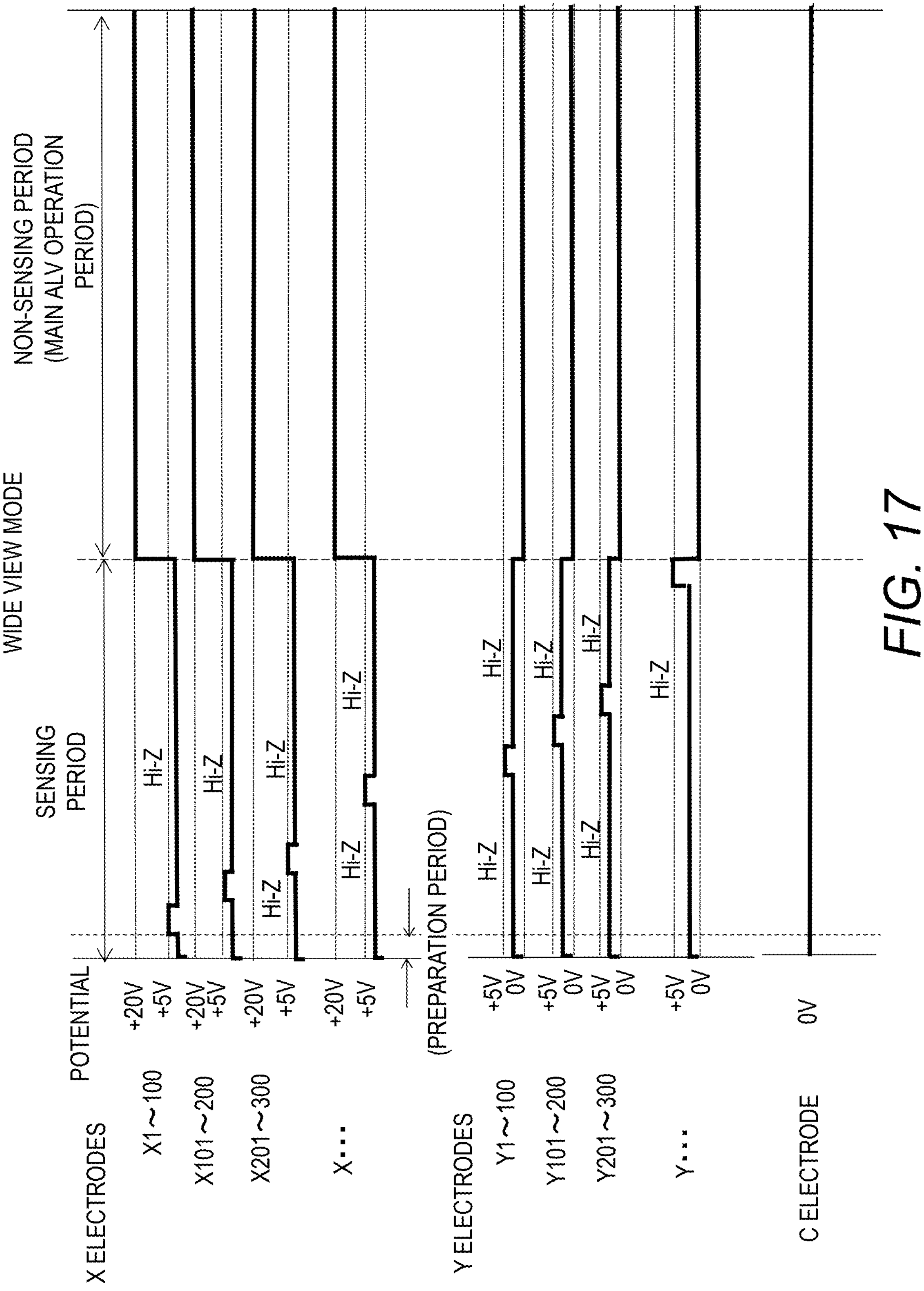
FIG. 17 is a timing chart illustrating still another example of temporal variation of the potentials of the upper touch panel electrodes (X electrodes), the lower touch panel electrodes (Y electrodes), and the lower viewing angle control electrode (C electrode) in a wide view mode.

FIG. 17 is a timing chart illustrating an example of temporal variation of the potentials of the upper touch panel electrodes (X electrodes) 121, the lower touch panel electrodes (Y electrodes) 123, and the lower viewing angle control electrode (C electrode) 126 in a wide view mode. Compared to the timing chart in a narrow view mode in FIG. 16, the potentials of the X electrodes in a non-sensing period are different. Specifically, the potentials of the X electrodes in a non-sensing period are +20 V. Since the potential of the lower viewing angle control electrode (C electrode) 126 is fixed at 0 V, a force is applied to the negatively charged electrophoretic particles 140 to gather them toward the X electrodes.

The description about the relation among a sensing period, a non-sensing period, and one frame period in mutual capacitive sensing is applicable to this self-capacitive sensing.

As described above, an embodiment of this specification makes some electrodes of the touch sensor (the upper touch panel electrodes 121) with the viewing angle control device to reduce the thickness of the viewing angle control device (active louver). In addition, a lower viewing angle control electrode (C electrode) 126 having a large area is used to control the behavior of the electrophoretic particles 140 to generate more uniform electric fields, which enables the viewing angle control device to operate uniformly within the plane.

An embodiment of this specification employs a time sequence with a short touch sensing period. The short touch sensing period reduces the effect of the electric fields onto the electrophoretic particles 140 in the touch sensing period and the long non-sensing period to apply electric fields for viewing angle control suppresses uneven dispersion of the electrophoretic particles 140 after switching the viewing angle characteristic. An embodiment of this specification only changes the potentials of the upper touch panel electrodes 121 for the viewing angle control in switching between a wide view and a narrow view. This configuration facilitates the control.

Hereinafter, an example of the method of manufacturing a display device including the viewing angle controllable touch panel 1 will be described. The following method is an example and the display device can be manufactured by any other method.

Figure 18A:
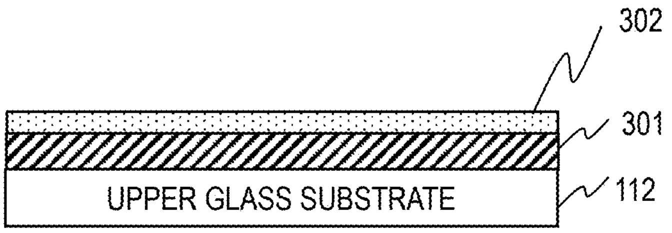
FIG. 18A illustrates a method of manufacturing a display device.

With reference to FIG. 18A, the manufacturing method deposits a metal film 301 on an upper glass substrate 112 and further, deposits an insulating film 302 thereabove.

Figure 18B:
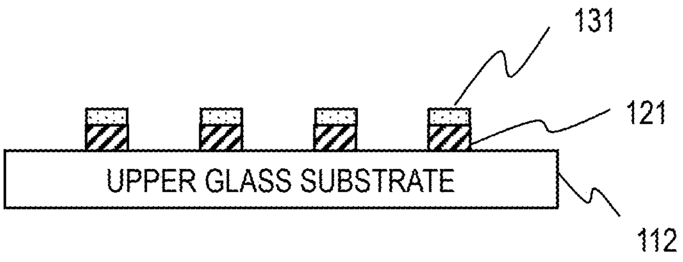
FIG. 18B illustrates a method of manufacturing a display device.

Next, with reference to FIG. 18B, the manufacturing method patterns the metal film 301 and the insulating film 302 together by photoresist application, exposure, development, and etching. As a result, the pattern of upper touch panel electrodes 121 and insulating films 131 is formed on the upper glass substrate 112.

Figure 18C:
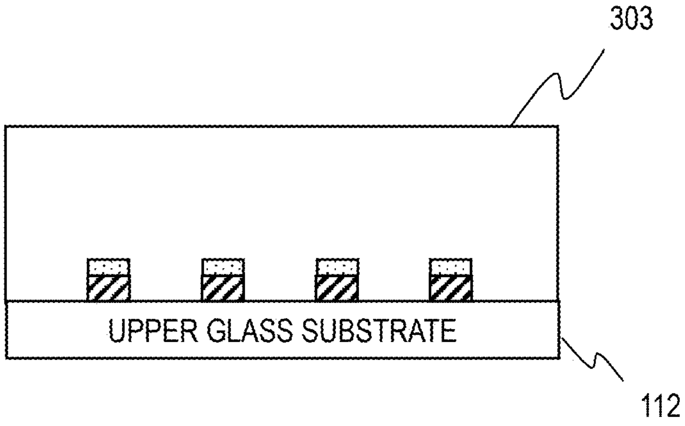
FIG. 18C illustrates a method of manufacturing a display device.

Next, with reference to FIG. 18C, the manufacturing method applies a photosensitive permanent film 303 onto the upper glass substrate 112 to cover the upper touch panel electrodes 121 and the insulating films 131 and pre-bakes them.

Figure 18D:
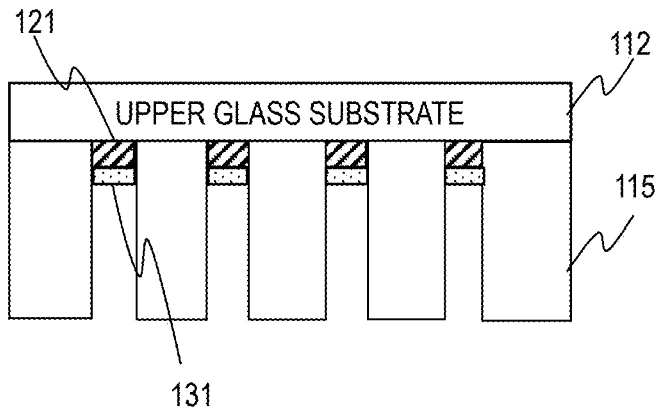
FIG. 18D illustrates a method of manufacturing a display device.

Next, with reference to FIG. 18D, the manufacturing method exposes and develops the photosensitive permanent film 303 using the upper touch panel electrodes 121 as masks to form transparent regions (light transmissive regions) 115. Through this step, the upper board is completed. The transparent regions 115 can be formed by nanoimprint technology, instead of the photolithography technology.

Figure 18E:
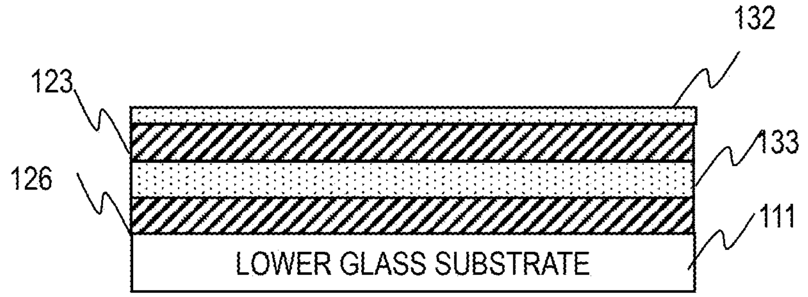
FIG. 18E illustrates a method of manufacturing a display device.

Next, with reference to FIG. 18E, the manufacturing method forms a lower viewing angle control electrode 126, an insulating film 133, lower touch panel electrodes 123, and insulating films 132. Through this step, the lower board is completed.

An example of this step deposits a metal film for the lower viewing angle control electrode 126 and an insulating film thereabove and forms the lower viewing angle control electrode 126 and the insulating film 133 by photoresist application, exposure, development, and etching. Furthermore, the step deposits a metal film for the lower touch panel electrodes 123 and an insulating film thereabove and forms the pattern of the lower touch panel electrodes 123 and the insulating films 132 by photoresist application, exposure, development, and etching.

Figure 18F:
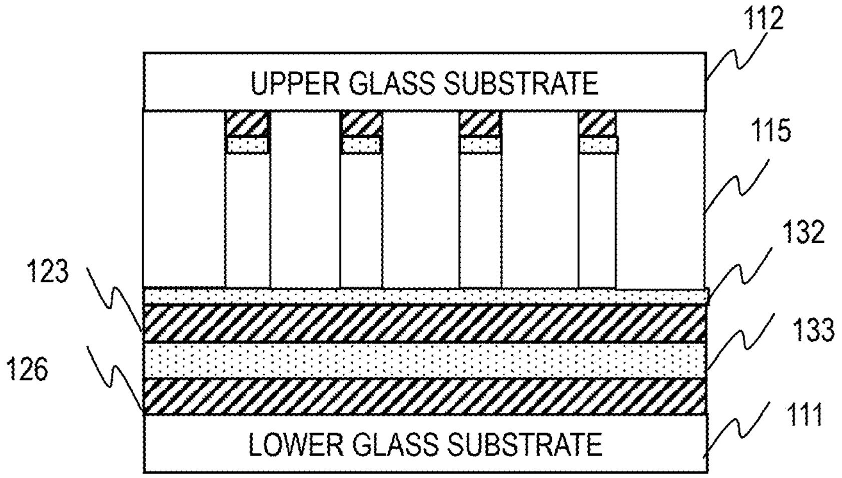
FIG. 18F illustrates a method of manufacturing a display device.
Figure 18G:
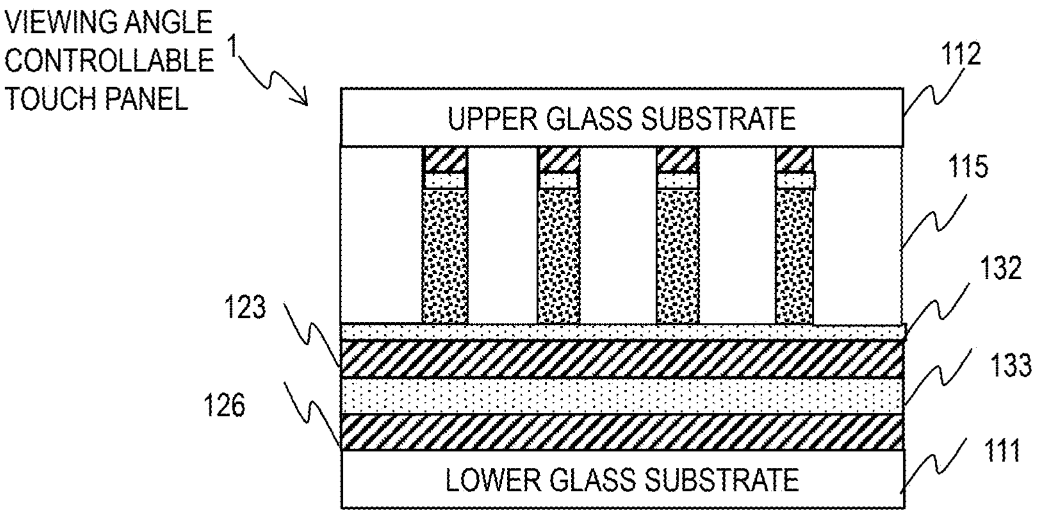
FIG. 18G illustrates a method of manufacturing a display device.
Figure 18H:
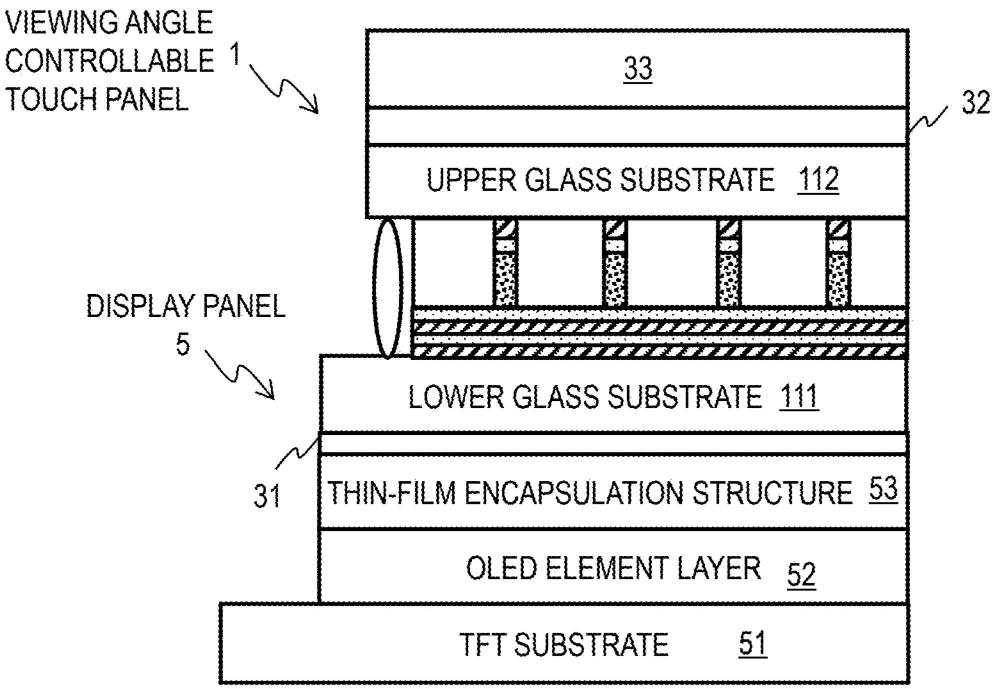
FIG. 18H illustrates a method of manufacturing a display device.

Next, with reference to FIG. 18F, the manufacturing method bonds the upper board and the lower board by heating and pressing to make a viewing angle controllable touch panel 1. In this process, the method electrically connects the terminals on the upper board and the terminals on the lower board with an anisotropic conducting film (ACF), for example. Next, with reference to FIG. 18G, the manufacturing method injects electrophoretic element material into the spaces between transparent regions 115. Next, with reference to FIG. 18H, the manufacturing method bonds the viewing angle controllable touch panel 1 to a display panel 5.

Figure 19:
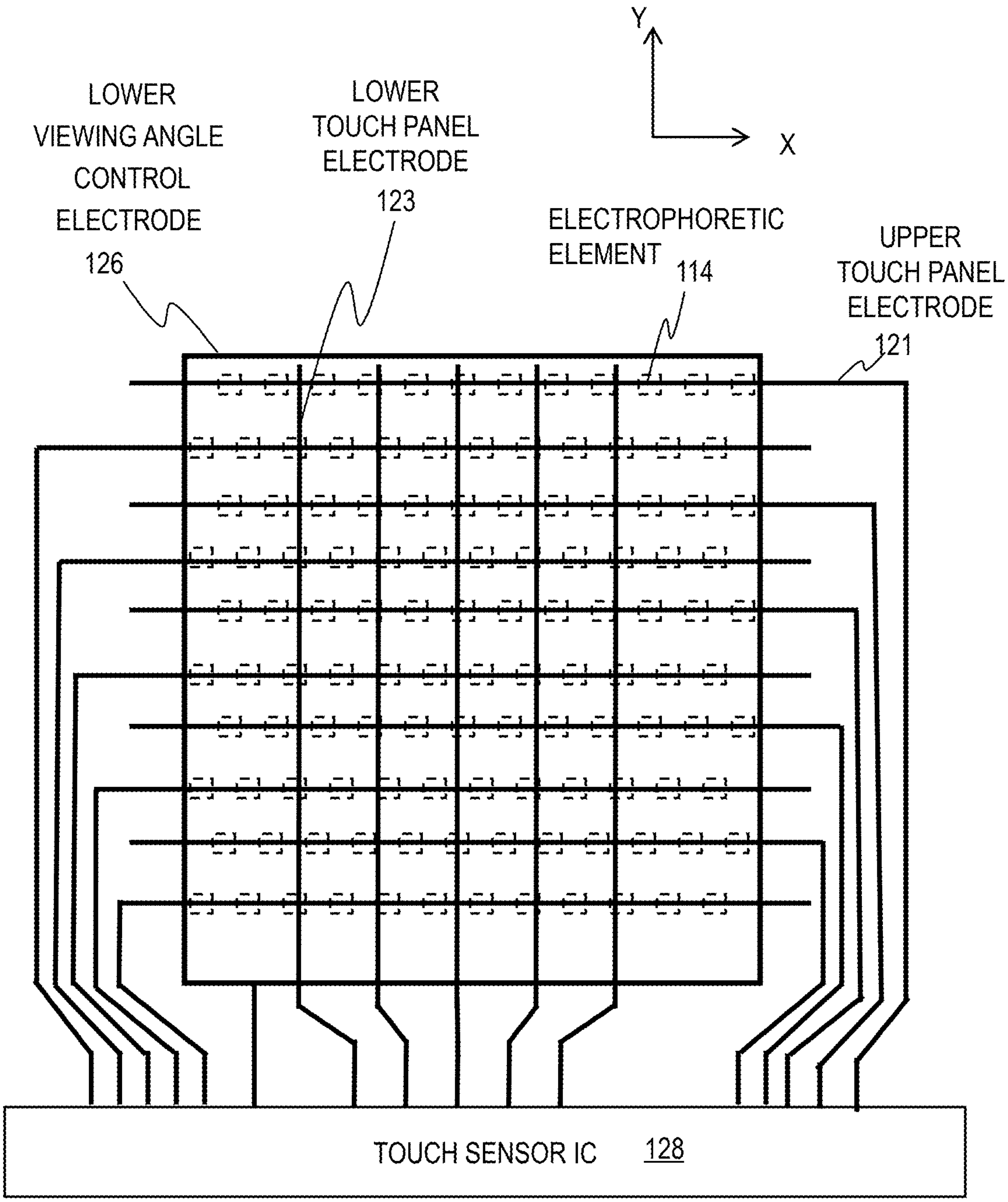
FIG. 19 illustrates a layout example of electrophoretic elements.

An example of the layout of electrophoretic elements 114 is described. FIG. 19 illustrates a layout example of electrophoretic elements 114. In this layout, the electrophoretic elements 114 have columnar shapes and disposed to be staggered. More specifically, electrophoretic element rows, each of which is composed of electrophoretic elements 114 aligned and being distant from one another in the x-axis direction, are located under the upper touch panel electrodes 121. Each electrophoretic element 114 is controlled by an upper touch panel electrode 121 and the lower viewing angle control electrode 126.

In each row, the electrophoretic elements 114 are disposed with equal spacing. The electrophoretic elements 114 in two consecutive electrophoretic element rows are staggered in the y-axis direction. That is to say, when viewed in the y-axis direction, each electrophoretic element 114 is located between adjacent electrophoretic elements 114 in each of the two adjacent rows above and below. This layout enables viewing angle control in the x-axis direction and y-axis direction.

Embodiment 2

Figure 20:
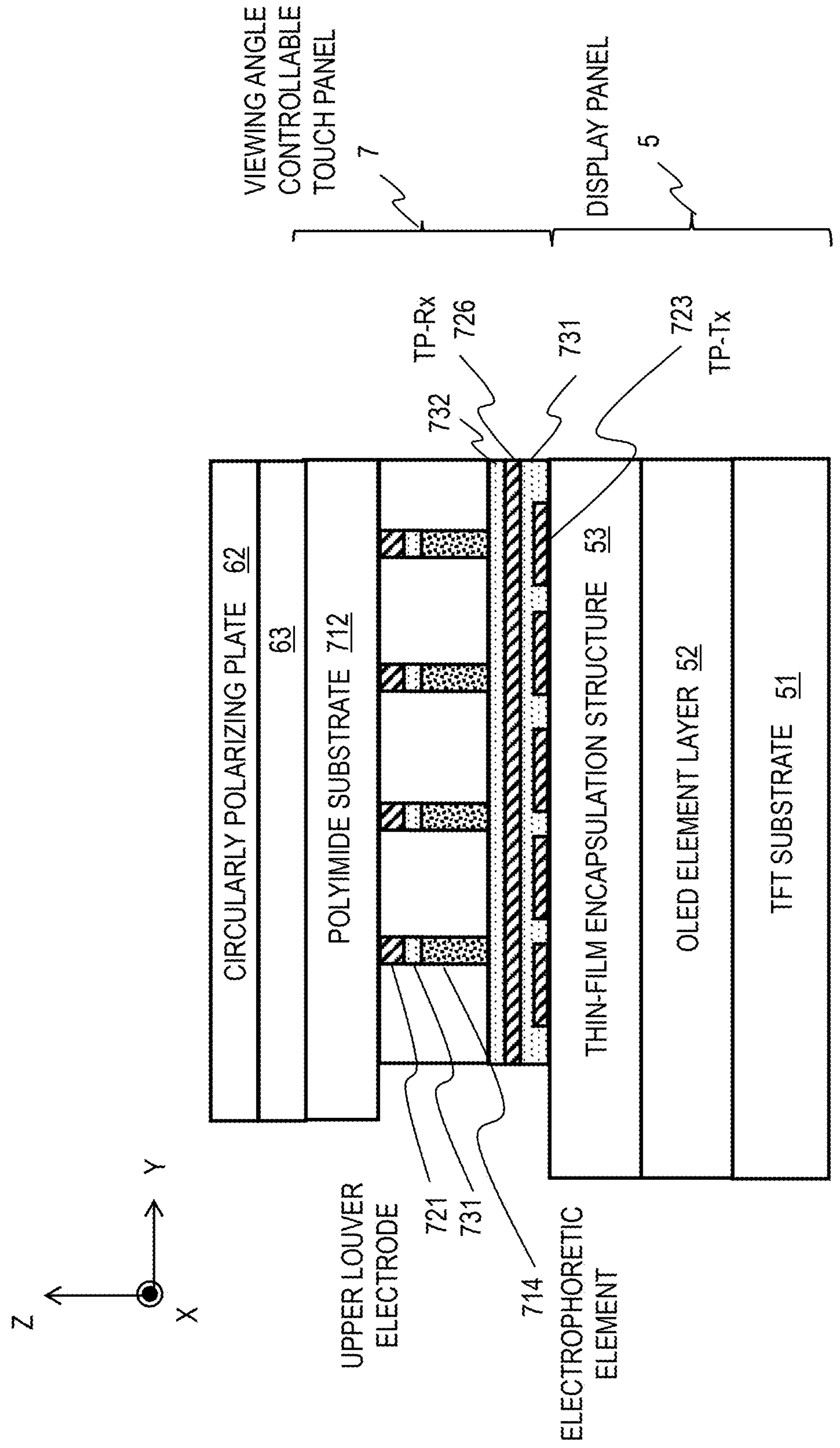
FIG. 20 schematically illustrates a structural example of a display device in another embodiment of this specification.

FIG. 20 schematically illustrates a structural example of a display device in another embodiment of this specification. Differences from the structural example in FIG. 1 are mainly described. Unless stated otherwise, the materials and the sizes of the components can be the same as those of the components of the same kinds described with reference to FIG. 1 and other drawings. The display device includes a display panel 5 and a viewing angle controllable touch panel 7 disposed in front of the display panel 5. The configuration of the display panel 5 is the same as that of the display panel 5 in FIG. 1.

The viewing angle controllable touch panel 7 is in direct contact with and disposed above the thin-film encapsulation structure 53. The thin-film encapsulation structure 53 is a multilayer encapsulation film to protect the OLED element from oxygen and moisture. The thin-film encapsulation structure 53 can include alternately layered inorganic material and organic material or only include inorganic material layers or organic material layers. Examples of the inorganic material include silicon nitride (SiNx), aluminum oxide ($Al_2O_3$) and examples of the organic material include acrylic resin. The thin-film encapsulation structure 53 can consist of two silicon nitride layers and an organic material layer therebetween; it can further include an additional inorganic material layer and/or an organic material layer.

The viewing angle controllable touch panel 7 includes transmitter electrodes (TP-Tx) 723, an insulating film 731, receiver electrodes (TP-Rx) 726, another insulating film 732, electrophoretic elements 714, upper louver electrodes 721, and a polyimide substrate 712 in this order from the bottom. The upper louver electrodes 721, the transmitter electrodes 723, and the receiver electrode 726 are electrically disconnected. The upper louver electrodes 721 are upper viewing angle control electrodes. The locations of the transmitter electrodes 723 and the receiver electrode 726 can be interchanged.

The viewing angle controllable touch panel 7 is disposed directly on top of the thin-film encapsulation structure 53. That is to say, the lower glass substrate 111 in the structural example in FIG. 1 is excluded. Compared to the structural example in FIG. 1, the cover glass 33 is also excluded and a flexible polyimide substrate 712 is provided in place of the upper glass substrate 112.

The polyimide substrate 712 and the circularly polarizing plate 62 are tightly bonded by an adhesive layer 63 disposed therebetween. The adhesive layer 63 can be made of resin. Although the following description is about an example of the structure of a mutual capacitive touch panel, a structure of a self-capacitive touch panel can also be employed.

A plurality of electrophoretic elements 714 are disposed between the thin-film encapsulation structure 53 and the polyimide substrate 712. The plurality of upper louver electrodes 721 are provided between the under face of the polyimide substrate 712 and the electrophoretic elements 714; each upper louver electrode 721 is opposed to an electrophoretic element 714 to control the dispersion state of electrophoretic particles. An insulating film 731 is provided between an electrophoretic element 714 and an upper louver electrode 721.

The state of the electrophoretic particles in the electrophoretic elements 714 is controlled by the electric fields between the upper louver electrodes 721 and the receiver electrodes (TP-Rx) 726 of the touch panel. The receiver electrodes 726 are also lower viewing angle control electrodes.

The viewing angle controllable touch panel 7 has an electrode structure different from that of the viewing angle controllable touch panel 1 in FIG. 1. The viewing angle controllable touch panel 7 includes a plurality of transmitter electrodes 723 provided directly on top of the thin-film encapsulation structure 53, an insulating film 731 covering the transmitter electrodes 723, a plurality of receiver electrodes 726 provided above the insulating film 731, and another insulating film 732 covering the insulating film 731 and the receiver electrodes 726. The transmitter electrodes 723 and the receiver electrodes 726 are electrodes for a mutual capacitive touch panel. Still another insulating film can be provided between the transmitter electrodes 723 and the thin-film encapsulation structure 53.

Figure 21:
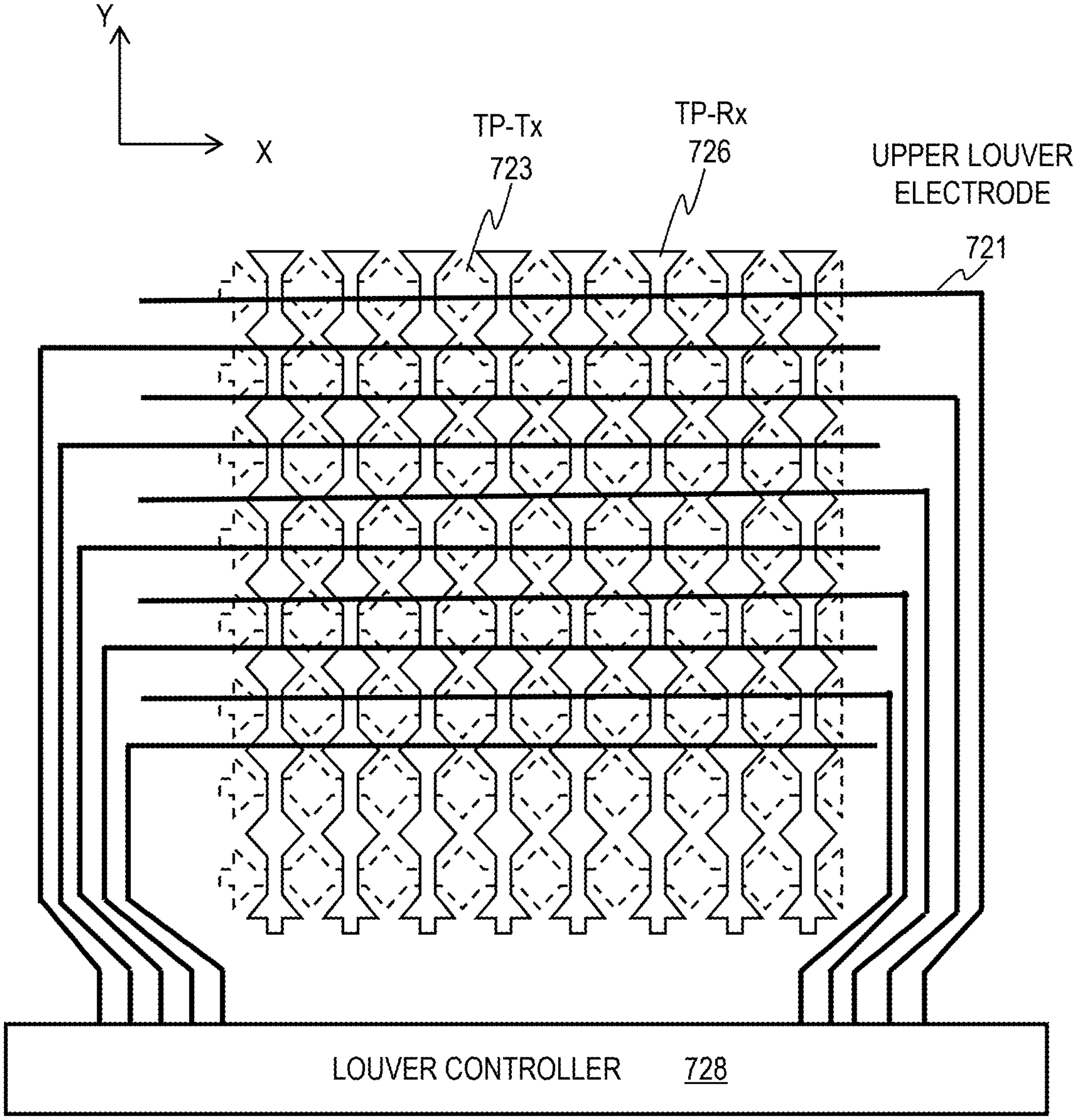
FIG. 21 illustrates an example of the electrode layout of a viewing angle controllable touch panel.

FIG. 21 illustrates an example of the electrode layout of the viewing angle controllable touch panel 7. The layout in FIG. 21 is merely an example; other layouts can be employed. The potentials of the upper louver electrodes 721 are controlled by a louver controller 728 included in the controller. The potentials of the transmitter electrodes 723 and the receiver electrodes 726 are controlled by a not-shown touch panel controller included in the controller. The touch panel controller measures the variations in the capacitances between electrodes to detect a touch point of a pointer based on the measurement results.

In the configuration example in FIG. 21, the upper louver electrodes 721 are X electrodes and they are disposed to extend in the x-axis direction and to be distant from one another in the y-axis direction. The widths of the upper louver electrodes 721 and their spacing can be uniform or different. The upper louver electrodes 721 can have a shape like a rectangular strip but the shape is not limited specifically. The transmitter electrodes 723 are X electrodes and they are disposed to extend in the x-axis direction and to be distant from one another in the y-axis direction. The spacing of the transmitter electrodes 723 can be uniform or different. The transmitter electrodes 723 can have a shape such that rhombic (rectangular) wide regions are connected by narrow strip-like joint regions as illustrated in FIG. 21 or other shapes such as a shape like a rectangular strip.

The receiver electrodes 726 are Y electrodes and they are disposed to extend in the y-axis direction and to be distant from one another in the x-axis direction. The spacing of the receiver electrodes 726 can be uniform or different. The receiver electrodes 726 can have a shape such that rhombic (rectangular) wide regions are connected by narrow strip-like joint regions as illustrated in FIG. 21 or other shapes such as a shape like a rectangular strip. In the configuration example of FIG. 21, the joint regions of the transmitter electrodes 723 overlap the joint regions of the receiver electrodes 726 in the layering direction and the wide regions of the transmitter electrodes 723 are away from the wide regions of the receiver electrodes 726 without overlapping each other.

Figure 22:
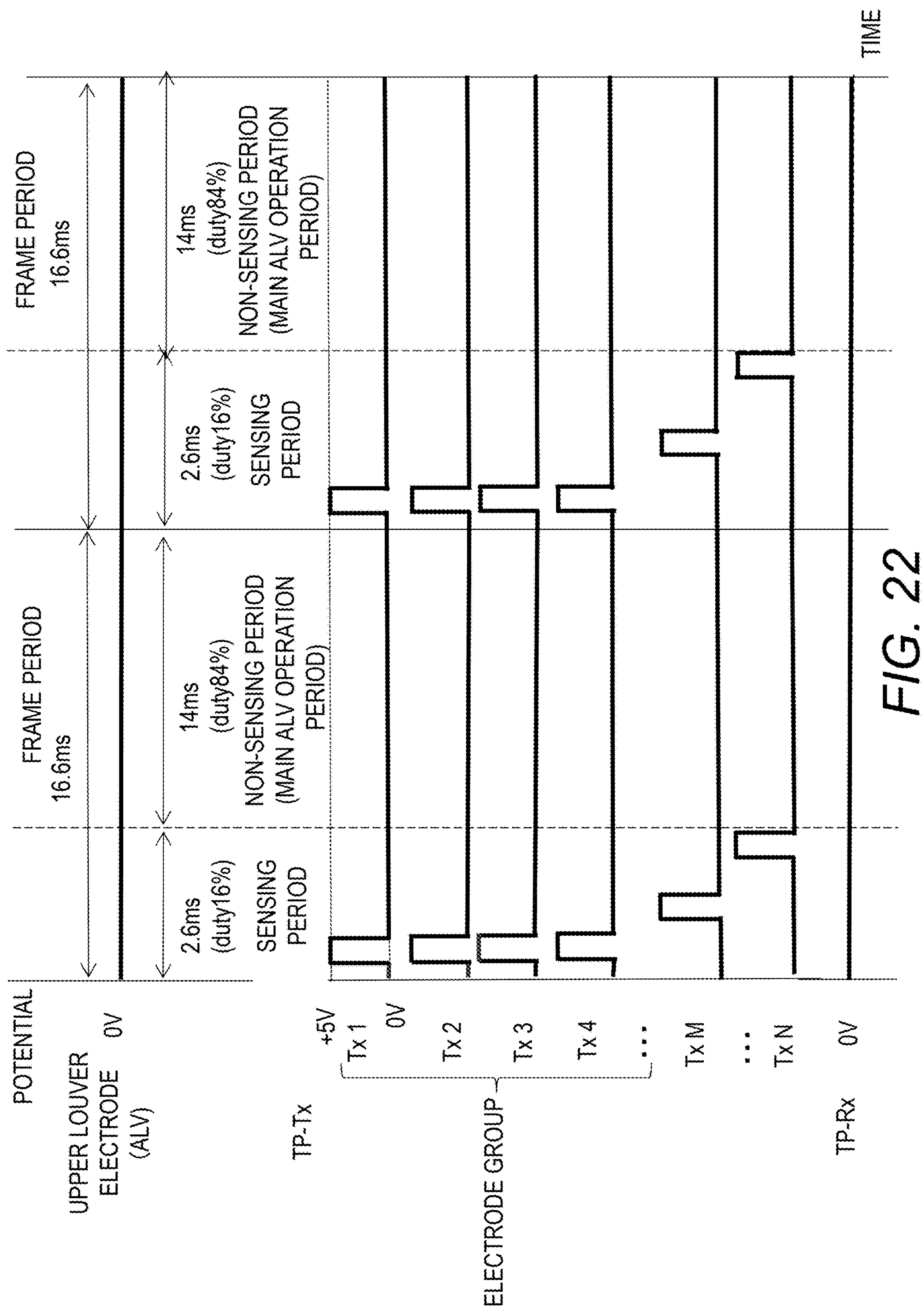
FIG. 22 is a timing chart illustrating an example of temporal variation of the potentials of upper louver electrodes, transmitter electrodes (TP-Tx), and receiver electrodes (TP-Rx) in a narrow view mode.

FIG. 22 is a timing chart illustrating an example of temporal variation of the potentials of the upper louver electrodes 721, the transmitter electrodes (TP-Tx) 723, and the receiver electrodes (TP-Rx) 726 in a narrow view mode. Compared to the timing chart of FIG. 11, the temporal variation of the potentials of the upper louver electrodes 721 are identical to the temporal variation of the potentials of the X electrodes (TP-Rx, ALV). The temporal variation of the potentials of the transmitter electrodes (TP-Tx) 723 is identical to the temporal variation of the potentials of the Y electrodes (TP-Tx). The temporal variation of the potentials of the receiver electrodes (TP-Rx) 726 is identical to the temporal variation of the potential of the C electrode. As described with reference to FIGS. 11 and 12, the driving pulses for the transmitter electrodes 723 for touch sensing are burst signals.

Figure 23:
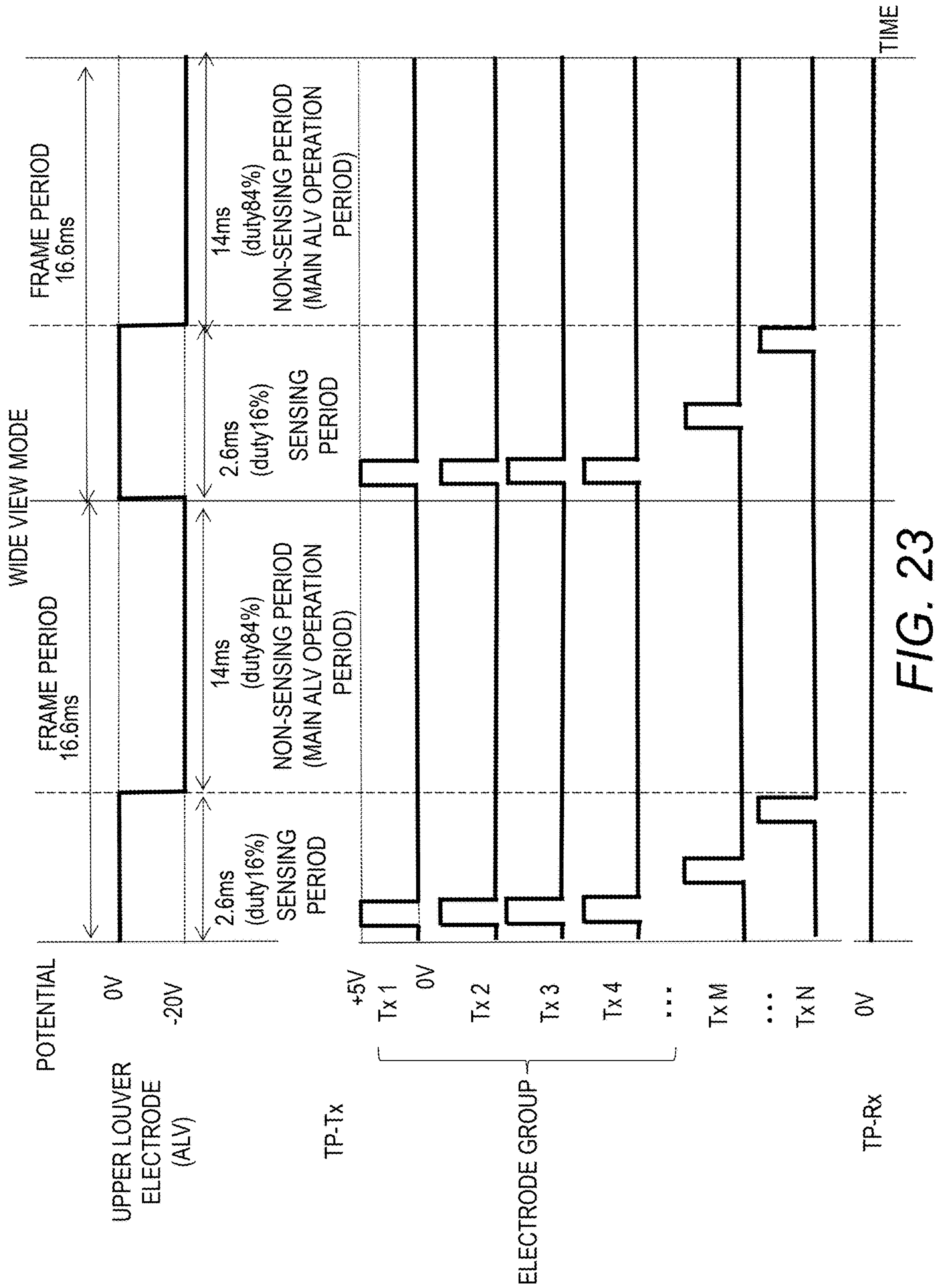
FIG. 23 is a timing chart illustrating an example of temporal variation of the potentials of upper louver electrodes, transmitter electrodes (TP-Tx), and receiver electrodes (TP-Rx) in a wide view mode.

FIG. 23 is a timing chart illustrating an example of temporal variation of the potentials of the upper louver electrodes 721, the transmitter electrodes (TP-Tx) 723, and the receiver electrodes (TP-Rx) 726 in a wide view mode. Compared to the timing chart of FIG. 22, the potential variation of the upper louver electrodes 721 is different. The potentials of the upper louver electrodes 721 in a non-sensing period are −20 V. The potentials of the upper louver electrodes 721 in a sensing period are 0 V, which is the same as the one in a narrow view state. The temporal variation of the potentials (signals) of the other electrodes is identical to those in a narrow view state.

In a non-sensing period, the upper louver electrodes 721 are supplied with −20 V and the receiver electrodes (TP-Rx) 726 that can function as lower viewing angle control electrodes and the transmitter electrodes (TP-Tx) 723 are supplied with 0 V. Accordingly, the negatively charged electrophoretic particles are gathered to the region closer to the receiver electrodes (TP-Rx) 726. This means that the viewing angle controllable touch panel 7 is in a wide view state. The negatively charged electrophoretic particles can be gathered to the region closer to the upper louver electrodes 721 by supplying a positive potential, for example +20 V, to the upper louver electrodes 721 in a non-sensing period.

Figure 24:
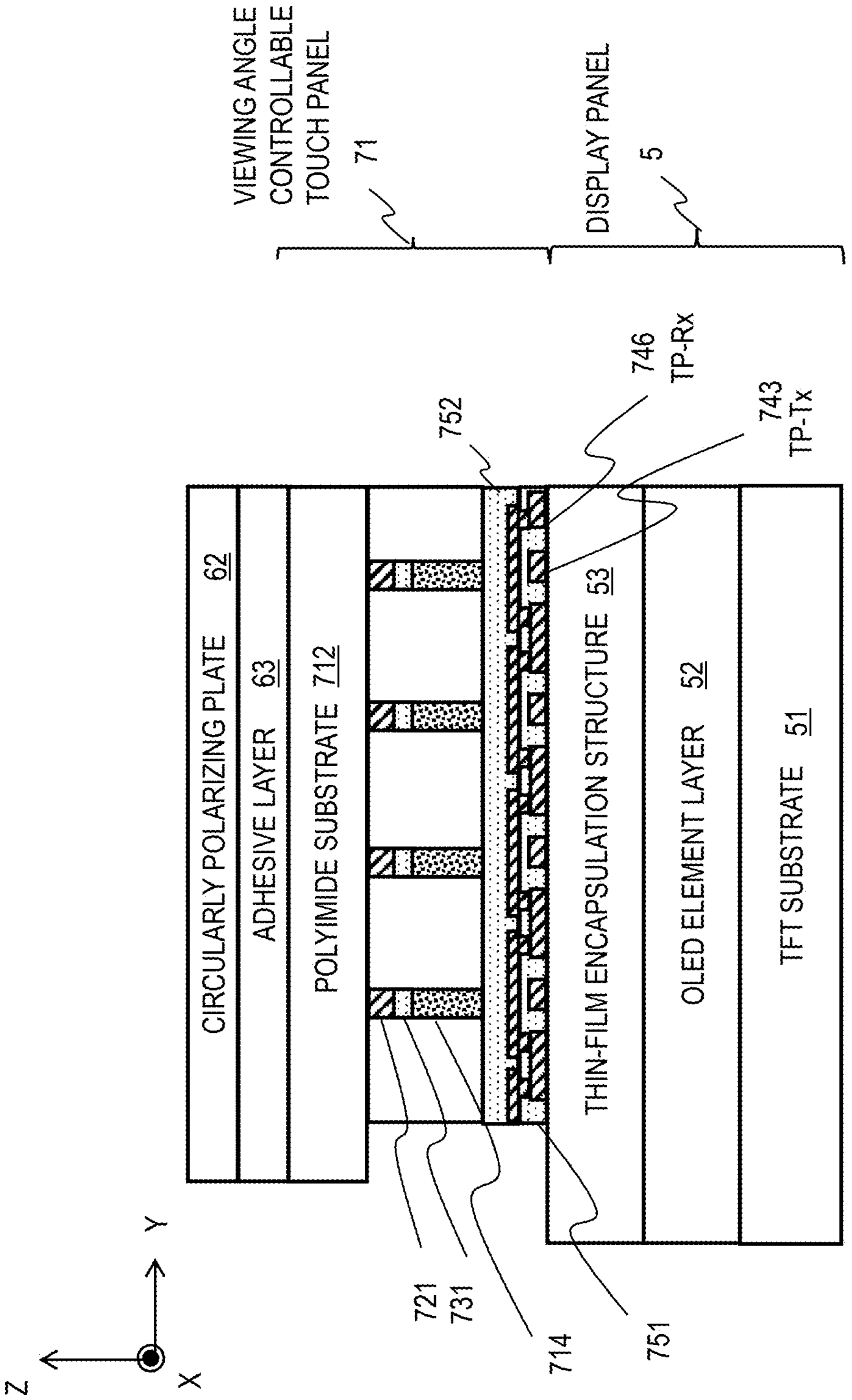
FIG. 24 is a cross-sectional diagram illustrating another structural example of a transmitter electrode pattern and a receiver electrode pattern.
Figure 25:
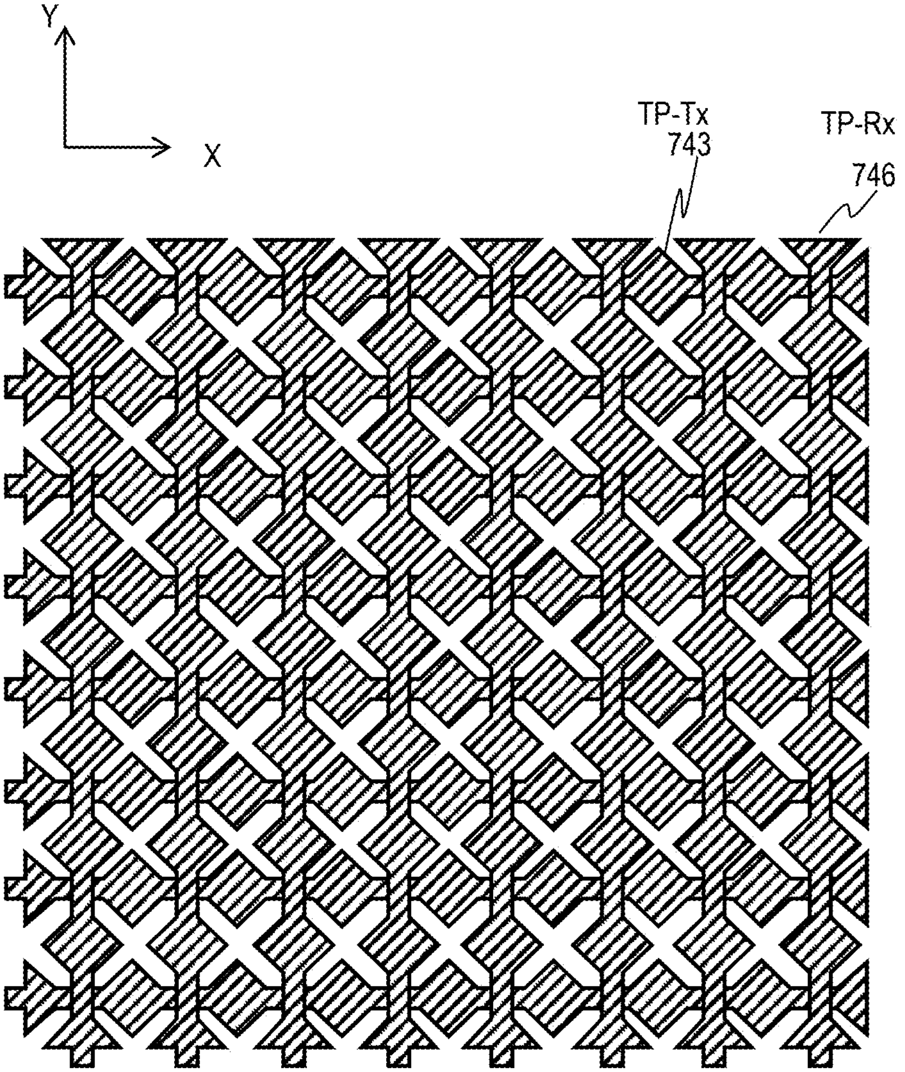
FIG. 25 is a plan diagram illustrating the other structural example of a transmitter electrode pattern and a receiver electrode pattern.

FIGS. 24 and 25 illustrate another structural example of the transmitter electrode pattern and the receiver electrode pattern. FIG. 24 is a cross-sectional diagram and FIG. 25 is a plan diagram. Differences from the structural example described with reference to FIGS. 20 and 21 are mainly described. The viewing angle controllable touch panel 71 includes a plurality of transmitter electrodes 743 and a plurality of receiver electrodes 746.

The transmitter electrodes 743 and the receiver electrodes 746 are provided directly on top of the thin-film encapsulation structure 53. More specifically, the entire regions of the transmitter electrodes 743 and the rhombic wide regions of the receiver electrodes 746 are provided directly on top of the thin-film encapsulation structure 53. The joint regions of the receiver electrodes 746 are provided above an insulating film 751 covering the wide regions of the receiver electrodes 746; each joint region extends to two adjacent wide regions through the insulating film 751 and connects them.

The wide regions and the joint regions of the transmitter electrodes 743 are provided directly on top of the thin-film encapsulation structure 53. The wide regions of the receiver electrodes 746 are provided directly on top of the thin-film encapsulation structure 53. These are included in the same metal layer. The wide regions and the joint regions of the transmitter electrodes 743 and the wide regions of the receiver electrodes 746 are covered with the insulating film 751. The wide regions of the transmitter electrodes 743 are physically separated from the wide regions of the receiver electrodes 746; the spaces therebetween is filled with parts of the insulating film 751.

The joint regions of the receiver electrodes 746 are provided on the insulating film 751 and each of them extends through holes in the insulating film 751 to reach two adjacent wide regions of the receiver electrode 746. Hence, the adjacent wide regions are tied and electrically connected. Although a joint region of a receiver electrode 746 overlaps a joint region of a transmitter electrode 743 in the layering direction, the insulating film 751 is interposed therebetween and therefore, they are physically separated. Because of this structure, the transmitter electrodes 743 and the receiver electrodes 746 are electrically disconnected.

The insulating film 751 and the joint regions of the receiver electrodes 746 thereabove are covered with an insulating film 752. A plurality of electrophoretic element 714 are disposed above the insulating film 752. The transmitter electrodes 743 and the receiver electrodes 746 can have any structure as far as they are disposed to avoid contact between a transmitter electrode 743 and a receiver electrode 746. For example, the structural relation between the transmitter electrodes 743 and the receiver electrodes 746 can be opposite to the relation in the structural example illustrated in FIGS. 24 and 25.

Figure 26:
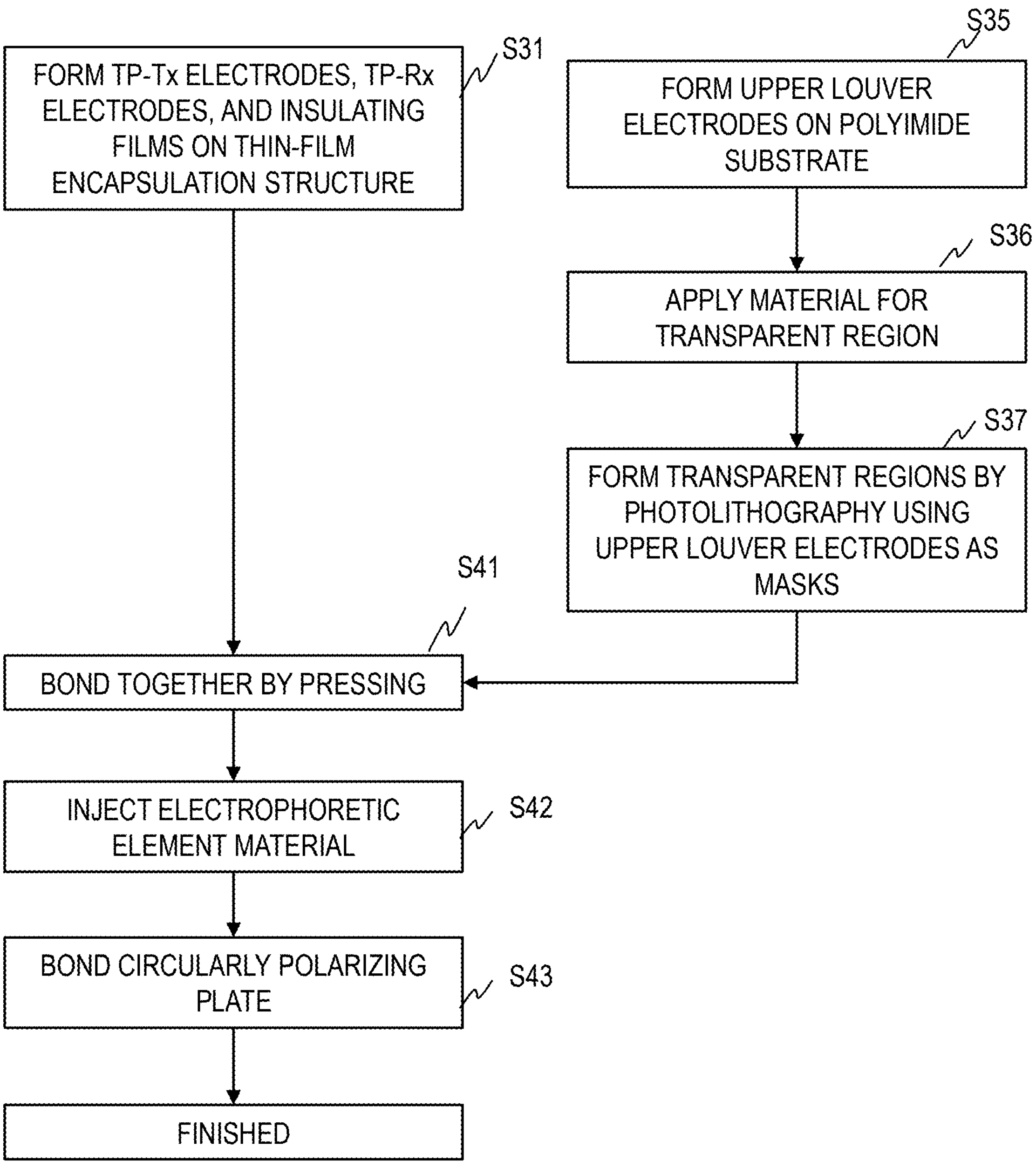
FIG. 26 is a flowchart of an example of the method of manufacturing a display device including a viewing angle controllable touch panel directly on top of a thin-film encapsulation structure.

FIG. 26 is a flowchart of an example of the method of manufacturing a display device including a viewing angle controllable touch panel directly on top of a thin-film encapsulation structure 53 like the configuration example described with reference to FIGS. 20 and 21 or FIGS. 24 and 25. As described above, there is no substrate interposed between the thin-film encapsulation structure 53 and the electrodes for touch sensing and viewing angle control.

The method of manufacturing a display device makes transmitter electrodes and receiver electrodes on the thin-film encapsulation structure 53, makes upper louver electrodes and spaces to inject electrophoretic element material in a transparent insulating film on a polyimide substrate to be opposed to the thin-film encapsulation structure 53 across the electrode pattern layer and electrophoretic elements, bonds the thin-film encapsulation structure and the polyimide substrate together, and injects electrophoretic element material to the spaces. The electrophoretic element material consists of electrophoretic particles 140 and a dispersion medium 141 as described above. For the method of forming the pattern of each layer, the description provided with reference to FIGS. 18A to 18H is applicable.

With reference to FIG. 26, the manufacturing method forms a pattern of transmitter electrodes (TP-Tx), a pattern of receiver electrodes (TP-Rx), and insulating films on a thin-film encapsulation structure (S31). For example, one insulating film is provided between the transmitter electrode pattern and the receiver electrode pattern and another insulating film is provided to cover them. No limitation exists on the multilayer structure including transmitter electrodes, receiver electrodes, and one or more insulating films unless the functions of touch sensing and viewing angle control are hampered.

Separately, the manufacturing method forms a pattern of upper louver electrodes on a polyimide substrate (S35) and applies a photosensitive permanent film as material for the light transmissive regions on the polyimide substrate with the upper louver electrodes and pre-bakes them (S36). The manufacturing method exposes and develops the photosensitive permanent film by photolithography using the pattern of the upper louver electrodes as a mask to form transparent regions (light transmissive regions). Through this process, transparent regions between electrophoretic elements are formed (S37). The transparent regions can be formed by nanoimprint technology, instead of the photolithography technology.

The manufacturing method bonds the component including the thin-film encapsulation structure and the electrode patterns thereon and the component including the polyimide substrate, the upper louver electrodes, and the transparent regions by heating and pressing (S41). Next, the manufacturing method injects electrophoretic element material to the spaces formed between transparent regions (S42) and bonds a circularly polarizing plate to the polyimide substrate on the opposite side of the electrophoretic elements (S43). Through the foregoing steps, the device is completed.

As set forth above, embodiments of this invention have been described; however, this invention is not limited to the foregoing embodiments. Those skilled in the art can easily modify, add, or convert each element in the foregoing embodiment within the scope of this invention. A part of the configuration of one embodiment may be replaced with a configuration of another embodiment or a configuration of an embodiment may be incorporated into a configuration of another embodiment.

What is claimed is:

1. A viewing angle controllable touch panel device comprising:

an upper transparent substrate;

a lower transparent substrate;

one lower viewing angle control electrode on a top face of the lower transparent substrate;

a plurality of lower touch panel electrodes on the top face of the lower transparent substrate;

a plurality of upper touch panel electrodes on an under face of the upper transparent substrate; and a plurality of electrophoretic elements disposed between the under face of the upper transparent substrate and the top face of the lower transparent substrate, each of the plurality of electrophoretic elements including electrophoretic particles and a dispersion medium, wherein the plurality of lower touch panel electrodes are included in a layer upper than the lower viewing angle control electrode, wherein each of the plurality of lower touch panel electrodes at least partially overlaps the lower viewing angle control electrode in a planar view, and wherein each of the plurality of electrophoretic elements is sandwiched between one of the plurality of upper touch panel electrodes and the lower viewing angle control electrode.

2. The viewing angle controllable touch panel device according to claim 1, further comprising:

a controller, wherein the controller is configured to control potentials of the plurality of upper touch panel electrodes, the plurality of lower touch panel electrodes, and the lower viewing angle control electrode, wherein the controller is configured to conduct the potential control in a sensing period and a non-sensing period that are repeated alternately, wherein the controller is configured to perform touch sensing in the sensing period by controlling potentials of the plurality of upper touch panel electrodes and the plurality of lower touch panel electrodes, wherein the controller is configured to control a viewing angle in the non-sensing period by controlling potentials of the plurality of upper touch panel electrodes and the lower viewing angle control electrode to control states of electrophoretic particles in the plurality of electrophoretic elements, and wherein the non-sensing period is longer than the sensing period.

3. The viewing angle controllable touch panel device according to claim 2, wherein the controller is configured to:

maintain the lower viewing angle control electrode at a constant potential during the sensing period and the non-sensing period; and supply the plurality of upper touch panel electrodes with a potential for the viewing angle control and the lower touch panel electrodes with the same potential as the lower viewing angle control electrode during the non-sensing period.

4. The viewing angle controllable touch panel device according to claim 2, wherein the controller is configured to:

maintain the lower viewing angle control electrode at a constant potential during the sensing period and the non-sensing period;

maintain the plurality of upper touch panel electrodes at a constant potential and select the plurality of lower touch panel electrodes one by one to supply a driving signal to the selected lower touch panel electrode during the sensing period, and supply the plurality of upper touch panel electrodes with a potential for the viewing angle control and the lower touch panel electrodes with the same potential as the lower viewing angle control electrode during the non-sensing period.

5. The viewing angle controllable touch panel device according to claim 1, further comprising:

first insulating films each disposed between an upper touch panel electrode and electrophoretic element material composed of electrophoretic particles and the dispersion medium;

second insulating films each disposed between a lower touch panel electrode and the electrophoretic element material; and a third insulating film disposed between the lower viewing angle control electrode and the lower touch panel electrodes, wherein the first insulating films, the second insulating films, and the third insulating film have sheet resistances ranging from 5E6Ω/□ to 5E8Ω/□.

6. The viewing angle controllable touch panel device according to claim 1, wherein the lower viewing angle control electrode is opposed to all electrophoretic elements disposed between the upper transparent substrate and the lower transparent substrate in a planar view.

7. A display device comprising:

a display panel; and a viewing angle controllable touch panel device according to claim 1 disposed in front of the display panel.

8. A display device comprising:

a display panel; and a viewing angle controllable touch panel device according to claim 2, wherein each frame period includes the sensing period and the non-sensing period.

9. A display device comprising:

an OLED display panel;

a viewing angle controllable touch panel device disposed on the display panel; and a controller, wherein the viewing angle controllable touch panel device includes:

a plurality of upper viewing angle control electrodes;

a plurality of first touch panel electrodes and a plurality of second touch panel electrodes disposed on a thin-film encapsulation structure of the OLED display panel without a substrate interposed; and a plurality of electrophoretic elements disposed between the plurality of upper viewing angle control electrodes and a touch panel electrode array including the plurality of first touch panel electrodes and the plurality of second touch panel electrodes in a layering direction, each electrophoretic element including electrophoretic particles and a dispersion medium, wherein the controller is configured to control potentials of the plurality of upper viewing angle control electrodes, wherein the controller is configured to conduct the potential control in a sensing period and a non-sensing period that are repeated alternately, wherein the controller is configured to perform touch sensing in the sensing period by controlling potentials of the plurality of first touch panel electrodes and the plurality of second touch panel electrodes, wherein the controller is configured to control a viewing angle in the non-sensing period by controlling states of electrophoretic particles in the plurality of electrophoretic elements with electric fields between the plurality of upper viewing angle control electrodes and the plurality of first and second touch panel electrodes, and wherein the non-sensing period is longer than the sensing period.

* * * * *